(12) United States Patent
Sasaki et al.

(10) Patent No.: US 7,056,443 B2
(45) Date of Patent: Jun. 6, 2006

(54) PIEZOELECTRIC CERAMIC PRODUCTION METHOD AND PIEZOELECTRIC ELEMENT PRODUCTION METHOD

(75) Inventors: Satoshi Sasaki, Tokyo (JP); Masaru Abe, Tokyo (JP)

(73) Assignee: TDK Corporation, Tokyo (JP)

( * ) Notice: Subject to any disclaimer, the term of this patent is extended or adjusted under 35 U.S.C. 154(b) by 238 days.

(21) Appl. No.: 10/448,212

(22) Filed: May 30, 2003

(65) Prior Publication Data
US 2003/0222240 A1    Dec. 4, 2003

(30) Foreign Application Priority Data
May 30, 2002    (JP) ............... 2002-156676

(51) Int. Cl.
*H01B 13/00*    (2006.01)
(52) U.S. Cl. ............. 216/18; 29/25.35; 310/311; 310/364; 252/62.9 PZ; 501/137
(58) Field of Classification Search ............... 216/13, 216/17, 18; 29/25.35; 310/311, 364; 252/62.9 R, 252/62.9 PZ; 501/134–139
See application file for complete search history.

(56) References Cited

U.S. PATENT DOCUMENTS

| | | | |
|---|---|---|---|
| 4,812,426 A | * | 3/1989 | Takagi et al. ............... 501/136 |
| 4,990,324 A | * | 2/1991 | Tomita et al. ............... 423/608 |
| 5,112,433 A | * | 5/1992 | Dawson et al. .......... 423/593.1 |
| 5,245,734 A | * | 9/1993 | Issartel ...................... 29/25.35 |
| 5,378,382 A | * | 1/1995 | Nishimura et al. ... 252/62.9 PZ |
| 2002/0175591 A1 | * | 11/2002 | Schreiner et al. ........... 310/311 |

FOREIGN PATENT DOCUMENTS

| | | |
|---|---|---|
| JP | 44-17344 | 7/1969 |
| JP | 45-39977 | 12/1970 |
| JP | A 61-129888 | 6/1986 |
| JP | 62-187116 A | 8/1987 |
| JP | 01-093419 | 4/1989 |
| JP | 402069352 A * | 3/1990 |
| JP | 09-278535 A | 10/1997 |
| JP | 2000-154059 A | 6/2000 |
| JP | A 2001-181035 | 7/2001 |
| JP | A 2001-181036 | 7/2001 |
| JP | 2002-308672 | 10/2002 |

* cited by examiner

*Primary Examiner*—Nadine G. Norton
*Assistant Examiner*—Eric B. Chen
(74) *Attorney, Agent, or Firm*—Oliff & Berridge, PLC

(57) ABSTRACT

A multilayer piezoelectric element 2 comprising an element body 10 wherein piezoelectric layers 8 and internal electrode layers 4 and 6 are alternately stacked. The piezoelectric layer 8 is composed of a piezoelectric ceramic. The piezoelectric ceramic includes a compound oxide having a perovskite structure. The compound oxide contains at least lead, zirconium and titanium. The method of producing the piezoelectric element includes the steps of producing a piezoelectric layer ceramic green sheet, forming a pre-fired element body by alternately stacking the produced piezoelectric ceramic green sheets and internal electrode layer precursor layers, and forming said element body 10 by performing main firing on the pre-fired element body at a temperature of 1100° C. or lower.

36 Claims, 7 Drawing Sheets

STRETCHING DIRECTION

STRETCHING DIRECTION

PIEZOELECTRIC CERAMIC PRODUCTION METHOD AND PIEZOELECTRIC ELEMENT PRODUCTION METHOD

BACKGROUND OF THE INVENTION

1. Field of the Invention

The present invention relates to a production method of a piezoelectric ceramic suitable to be used for a piezoelectric layer of a variety of piezoelectric elements, for example, a piezoelectric actuator, a piezoelectric buzzer, a sounding body and a sensor, and a production method of a piezoelectric element having a piezoelectric layer composed of the piezoelectric ceramic.

2. Description of the Related Art

As a piezoelectric ceramic mainly containing lead (Pb), zirconium (Zr), titanium (Ti), zinc (Zn) and niobium (Nb), a ternary piezoelectric ceramic expressed by a general formula: $Pb(Zn_{1/3} Nb_{2/3})O_3$—$PbTiO_3$—$PbZrO_3$, those obtained by replacing a part of lead atoms by barium (Ba) and strontium (Sr) and those added with a variety of trace of oxides thereto have been conventionally used.

Also, as a piezoelectric ceramic mainly containing lead, zirconium, titanium, zinc, magnesium (Mg) and niobium, a quaternary piezoelectric ceramic expressed by a general formula: $Pb (Zn_{1/3} Nb_{2/3})O_3$—$Pb (Mg_{1/3} Nb_{2/3})O_3$—$PbTiO_3$—$PbZrO_3$ and those added with a variety of trace of oxides thereto are used.

The piezoelectric ceramics are widely applied to a piezoelectric actuator, a piezoelectric buzzer, a sounding body and a sensor, etc. for being excellent in piezoelectric characteristics, workability and mass productivity as disclosed in the Japanese Examined Patent Publication No. 44-17344, the Japanese Examined Patent Publication No. 45-39977, the Japanese Unexamined Patent Publication No.61-129888, the Japanese Unexamined Patent Publication No. 3-256379, the Japanese Unexamined Patent Publication No.8-151264, the Japanese Unexamined Patent Publication No. 2001-181035, the Japanese Unexamined Patent Publication No. 2001-181036, etc.

In recent years, for devices to which a piezoelectric element is applied, those using a multilayer element wherein piezoelectric layers composed of a piezoelectric ceramic and internal electrode layers are alternately stacked, such as a multilayer piezoelectric actuator, have been actively developed. Such a multilayer actuator has advantages of being compact and able to obtain a large displacement in a small electric field.

However, when producing the multilayer actuator, the normal method is to fire after forming internal electrodes. Therefore, in a conventionally known piezoelectric ceramic fired at 1200° C. or higher, thermoduric expensive precious metals, such as platinum (Pt) and palladium (Pd), have to be used as the internal electrodes and there has been a disadvantage in production costs.

As a more inexpensive internal electrodes material, silver and palladium alloy (Ag—Pd alloy) is known. However, when a content of palladium exceeds 30 wt %, palladium causes a reducing reaction during firing which leads to arising of a crack in a piezoelectric element body or peeling of electrodes and other defaults. Thus, the content of palladium in the alloy is preferably 30 wt % or less. To make the content of palladium in the alloy 30 wt % or less, a firing temperature has to be 1150° C. or lower, preferably 1120° C. or lower based on a silver-palladium system phase diagram. Furthermore, the content of palladium has to be small to reduce the production cost, thus, the firing temperature is required to be as low as possible. For example, to make the content of palladium 20 wt % or less, the firing temperature has to be 1100° C. or lower, preferably 1000° C. or lower.

On the other hand, when the firing temperature is too low, densification for vitrification cannot be attained and a piezoelectric ceramic having a sufficient property cannot be obtained. The conventionally known piezoelectric ceramics of this kind are produced by performing main firing at a high temperature of 1200° C. or so, thus, to attain complete sintering even at a low temperature, troublesome handling was necessary such that starting materials of the piezoelectric ceramic is once subjected to temporary firing, then grinded to obtain powder having a large specific surface area, or pressed during main firing.

Also, to lower the main firing temperature, methods of adding a glass component, such as silicon dioxide ($SiO_2$), or adding excessive lead oxide (PbO) have been proposed. In the method, however, property of the piezoelectric ceramic is deteriorated so it is not preferable.

SUMMARY OF THE INVENTION

An object of the present invention is to provide a method of producing a piezoelectric ceramic capable of using inexpensive metals as internal electrodes and hardly deteriorating piezoelectric properties, as a piezoelectric ceramic suitable to piezoelectric layers of a multilayer piezoelectric element, such as a multilayer actuator element, and a method of producing a single-plate type and multilayer type piezoelectric elements having piezoelectric layers composed of the piezoelectric ceramic.

Production Method of Piezoelectric Ceramic

To attain the above object, according to the first aspect of the present invention, there is provided a piezoelectric ceramic production method for producing a piezoelectric ceramic including a compound oxide having a perovskite structure, wherein the compound oxide contains at least lead(Pb), zirconium(Zr) and titanium(Ti), wherein the piezoelectric ceramic is produced by using a material mixture of a 90%-cummulated particle diameter of 1 μm or less, containing compounds of at least lead, zirconium and titanium.

In the first aspect, the compound oxide mainly contains lead, zirconium, titanium, zinc (Zn), and niobium (Nb) (a second aspect), mainly contains lead, zirconium, titanium, zinc, magnesium (Mg) and niobium (a third aspect), mainly contains lead, zirconium, titanium, zinc and niobium, and at least one kind selected from barium (Ba), strontium (Sr) and calcium (Ca) (a fourth aspect), or mainly contains lead, zirconium, titanium, zinc, magnesium and niobium, and at least one kind selected from barium, strontium and calcium (a fifth aspect).

According to a second aspect of the present invention, there is provided a piezoelectric ceramic production method for producing a piezoelectric ceramic including a compound oxide having a perovskite structure, wherein the compound oxide mainly contains lead, zirconium, titanium, zinc and niobium, wherein the piezoelectric ceramic is produced by using a material mixture of a 90%-cummulated particle diameter of 1 μm or less, containing compounds of lead, zirconium, titanium, zinc and niobium.

In the second aspect, preferably, the compound oxide is expressed by a general formula $Pb_{A1}(Zn_{1/3} Nb_{2/3})_{a1} Ti_{b1} Zr_{c1}]O_3$ and respective mol fractions in the formula are $0.99 \leq A1 \leq 1.01$, $0.05 \leq a1 \leq 0.25$, $0.2 \leq b1 < 0.5$ and $a1+b1+c1=1$.

According to a third aspect of the present invention, there is provided a piezoelectric ceramic production method for producing a piezoelectric ceramic including a compound oxide having a perovskite structure, wherein the compound oxide mainly contains lead, zirconium, titanium, zinc, magnesium and niobium, wherein the piezoelectric ceramic is produced by using a material mixture of a 90%-cummulated particle diameter of 1 μm or less, containing compounds of lead, zirconium, titanium, zinc, magnesium and niobium.

In the third aspect, preferably, the compound oxide is expressed by a general formula $Pb_{A2}[(Zn_{1/3}Nb_{2/3})_{a2}(Mg_{1/3}Nb_{2/3})_{d2}Ti_{b2}Zr_{c2}]O_3$ and respective mol fractions in the formula are $0.99 \leq A2 \leq 1.01$, $0.05 \leq a2 \leq 0.25$, $0.2 \leq b2 \leq 0.5$, $0.15 \leq (a2+d2) \leq 0.5$ and $a2+b2+c2+d2=1$.

According to a fourth aspect of the present invention, there is provided a piezoelectric ceramic production method for producing a piezoelectric ceramic including a compound oxide having a perovskite structure, wherein the compound oxide mainly contains lead, zirconium, titanium, zinc and niobium, and at least one kind selected from barium, strontium and calcium wherein the piezoelectric ceramic is produced by using a material mixture of a 90%-cummulated particle diameter of 1 μm or less, containing compounds of lead, zirconium, titanium, zinc and niobium and at least one kind of compound selected from barium, strontium and calcium.

In the fourth aspect, preferably, the compound oxide is expressed by a general formula $(Pb_{A1^{-B1}}Me_{B1})[(Zn_{1/3}Nb_{2/3})_{a1}Ti_{b1}Zr_{c1}]O_3$ and elements and respective mol fractions in the formula are Me=at least one kind of element selected from a group composed of Ba, Sr and Ca, $0.99 \leq A1 \leq 1.01$, $0 < B1 \leq 0.1$, $0.05 \leq a1 \leq 0.25$, $0.2 \leq b1 \leq 0.5$, and $a1+b1+c1=1$.

According to a fifth aspect of the present invention, there is provided a piezoelectric ceramic production method for producing a piezoelectric ceramic including a compound oxide having a perovskite structure, wherein the compound oxide mainly contains lead, zirconium, titanium, zinc, magnesium and niobium, and at least one kind selected from barium, strontium and calcium, wherein the piezoelectric ceramic is produced by using a material mixture of a 90%-cummulated particle diameter of 1 μm or less, containing compounds of lead, zirconium, titanium, zinc, magnesium and niobium and at least one kind of compound selected from barium, strontium and calcium.

In this fifth aspect, preferably, the compound oxide is expressed by a general formula $(Pb_{A2^{-B2}}Me_{B2})[(Zn_{1/3}Nb_{2/3})_{a2}(Mg_{1/3}Nb_{2/3})_{d2}Ti_{b2}Zr_{c2]O3}$ and elements and respective mol fractions in the formula are Me=at least one kind of element selected from a group composed of Ba, Sr and Ca, $0.99 \leq A2 \leq 1.01$, $0 < B2 \leq 0.1$, $0.05 \leq a2 \leq 0.25$, $0.2 \leq b2 \leq 0.5$, $0.15 \leq (a2+d2) \leq 0.5$ and $a2+b2+c2+d2=1$.

According to the above first to fifth aspects, a material mixture wherein a 90%-cummulated particle diameter is controlled to be not more than a predetermined value in producing a so-called PZT (lead zirconate titanate) base piezoelectric ceramic. Since a mixing degree of the material mixture is heightened, a solid-phase reaction at the time of temporary firing becomes preferable, as a result, the firing temperature at the time of main firing can be made as low as for example 1100° C. or lower.

Note that the PZT base piezoelectric ceramic generally means that a total content of Pb, Zr and Ti as three main elements in a composite oxide composing the piezoelectric ceramic is 90 wt % or more.

In the first to fifth aspects, the piezoelectric ceramic may include a subcomponent other than a main component including the above compound oxide as explained in the sixth aspect.

According to a sixth aspect of the present invention, there is provided a piezoelectric ceramic production method for producing a piezoelectric ceramic including a compound oxide having a perovskite structure, wherein the compound oxide includes a main component containing at least lead, zirconium and titanium, and a subcomponent containing at least one kind of oxide selected from steel (Fe), nickel (Ni), copper (Cu) and cobalt (Co), and a content of the subcomponent is 0.01 to 0.8 wt % in a conversion of oxides ($Fe_2O_3$, CoO, NiO and CuO) with respect to a weight of 1 mol of the main component;

wherein the piezoelectric ceramic is produced by using a material mixture of a 90%-cummulated particle diameter of 1 μm or less, including main component materials containing compounds of at least lead, zirconium and titanium.

According to the sixth aspect, by adding subcomponent materials including at least one kind of compound selected from iron, nickel, copper and cobalt at the time of producing the piezoelectric ceramic, sinterability can be furthermore improved and the main firing temperature can be made as low as for example 1050° C. or lower.

In any of the above first to sixth aspects, a main firing is performed for example after performing temporary firing (calcining). In the sixth aspect, a subcomponent material including at least one kind of compound selected from iron, nickel, copper and cobalt corresponding to at least one kind of oxide selected from iron, nickel, copper and cobalt may be contained before or after the temporary firing. Note that it is preferable to contain before the calcining.

Namely, in the sixth aspect, it is preferable to use a material mixture including a subcomponent materials containing at least one kind of compound selected from steel, nickel, copper and cobalt corresponding to the oxides to be contained in the subcomponent other than the main component materials containing compounds of at least lead, zirconium and titanium. By containing the same before the calcining, more homogeneous piezoelectric ceramic can be obtained. It is preferable to use an oxide as the compound when containing the same after the calcining.

The piezoelectric ceramic produced by the respective methods as explained above is used as a material of piezoelectric elements, such as an actuator, a piezoelectric buzzer and a sounding body and sensor, and particularly preferably used as a material of an actuator.

Production Method of Piezoelectric Element

The above explained production methods of piezoelectric ceramic according to the respective aspects can be applied to a production method of a piezoelectric element.

A piezoelectric element to be produced is not particularly limited as far as it is a piezoelectric element having a piezoelectric layer, and, for example, a multilayer piezoelectric element having an element body wherein, for example, piezoelectric layers and internal electrode layers are alternately stacked. In the present invention, the piezoelectric layers are composed of a piezoelectric ceramic produced by any one of the above methods. A conductive material included in the internal electrode layers is not particularly limited and, for example, at least one kind of Ag, Au, Pt and Pb or an alloy thereof.

A particularly preferable production method of a piezoelectric element is described below.

According to a first aspect of the present invention, there is provided a piezoelectric element production method for producing a piezoelectric element comprising a piezoelectric layer, wherein the piezoelectric layer is composed of a piezoelectric ceramic, wherein the piezoelectric ceramic includes a compound oxide having the perovskite structure, wherein the compound oxide contains at least lead, zirconium and titanium, wherein the piezoelectric ceramic is produced by using a material mixture of a 90%-cummulated particle diameter of 1 µm or less, including compounds of at least lead, zirconium and titanium.

According to a second aspect of the present invention, there is provided a piezoelectric element production method for producing a piezoelectric element comprising a piezoelectric layer, wherein the piezoelectric layer is composed of a piezoelectric ceramic, wherein the piezoelectric ceramic includes a compound oxide having the perovskite structure, wherein the compound oxide mainly contains lead, zirconium, titanium, zinc and niobium, wherein the piezoelectric ceramic is produced by using a material mixture of a 90%-cummulated particle diameter of 1 µm or less, including compounds of lead, zirconium, titanium, zinc and niobium.

According to a third aspect of the present invention, there is provided a piezoelectric element production method for producing a piezoelectric element comprising a piezoelectric layer, wherein the piezoelectric layer is composed of a piezoelectric ceramic, wherein the piezoelectric ceramic includes a compound oxide having the perovskite structure, wherein the compound oxide mainly contains lead, zirconium, titanium, zinc, magnesium and niobium, wherein the piezoelectric ceramic is produced by using a material mixture of a 90%-cummulated particle diameter of 1 µm or less, including compounds of lead, zirconium, titanium, zinc, magnesium and niobium.

According to a fourth aspect of the present invention, there is provided a piezoelectric element production method for producing a piezoelectric element comprising a piezoelectric layer, wherein the piezoelectric layer is composed of a piezoelectric ceramic, wherein the piezoelectric ceramic includes a compound oxide having the perovskite structure, wherein the compound oxide mainly contains lead, zirconium, titanium, zinc and niobium and at least one kind selected from barium, strontium and calcium, wherein the piezoelectric ceramic is produced by using a material mixture of a 90%-cummulated particle diameter of 1 µm or less, including compounds of lead, zirconium, titanium, zinc and niobium and at least one kind of compound selected from barium, strontium and calcium.

According to a fifth aspect of the present invention, there is provided a piezoelectric element production method for producing a piezoelectric element comprising a piezoelectric layer, wherein the piezoelectric layer is composed of a piezoelectric ceramic, wherein the piezoelectric ceramic includes a compound oxide having the perovskite structure, wherein the compound oxide mainly contains lead, zirconium, titanium, zinc, magnesium and niobium and at least one kind selected from barium, strontium and calcium, wherein the piezoelectric ceramic is produced by using a material mixture of a 90%-cummulated particle diameter of 1 µm or less, including compounds of lead, zirconium, titanium, zinc, magnesium and niobium and at least one kind of compound selected from barium, strontium and calcium.

According to a sixth aspect of the present invention, there is provided a piezoelectric element production method for producing a piezoelectric element comprising a piezoelectric layer, wherein the piezoelectric layer is composed of a piezoelectric ceramic, wherein the piezoelectric ceramic includes a main component and a subcomponent, wherein the main component includes a compound oxide having the perovskite structure, wherein the compound oxide contains at least lead, zirconium and titanium, and the subcomponent contains at least one kind of oxide selected from steel, nickel copper and cobalt, wherein a content of the subcomponent is 0.01 to 0.8 wt % in a conversion of oxides ($Fe_2O_3$, CoO, NiO and CuO) with respect to a weight of 1 mol of the main component, wherein the piezoelectric ceramic is produced by using a material mixture of a 90%-cummulated particle diameter of 1 µm or less, including compounds of at least lead, zirconium and titanium.

In the first to sixth aspects of the present invention, it is preferable that after the piezoelectric ceramic is produced and the piezoelectric layers are formed, the electrodes are formed on the surface of the piezoelectric layers.

In the present invention, preferably, a lead oxide in a form of $Pb_3O_4$ is used as a compound of lead. Preferably, a zirconium oxide having a specific surface area of 20 to 50 $m^2/g$ is used as a compound of zirconium. Preferably, a titanium oxide having a rate of becoming an anatase type of 80% or more and a specific surface area of 10 to 50 $m^2/g$ is used as a compound of titanium. The higher the rate of becoming an anatase type, reactivity at the time of calcining improves. By using specific materials as such, grinding and mixing of material powders can be efficiently performed, reactivity at the time of calcining can be improved and a main firing temperature can be lowered.

In the present invention, it is preferable to include the steps of calcining the material mixture to obtain a calcined result, cruching the calcined result to obtain calcined powder, and performing main firing on the calcined powder to obtain the piezoelectric ceramic composed of a sintered body.

Production Method of Multilayer Piezoelectric Element

According to a first aspect of the present invention, there is provided a piezoelectric element production method for producing a multilayer piezoelectric element comprising an element body wherein piezoelectric layers and internal electrode layers are alternately stacked, wherein the piezoelectric layer is composed of a piezoelectric ceramic, wherein the piezoelectric ceramic includes a compound oxide having a perovskite structure, wherein the compound oxide contains at least lead, zirconium and titanium, including the steps of:

producing a piezoelectric layer ceramic green sheet by using a material mixture of a 90%-cummulated particle diameter of 1 µm or less, containing compounds of at least lead, zirconium and titanium;

forming a pre-fired element body by alternately stacking the produced piezoelectric layer ceramic green sheets and internal electrode precursor layers; and forming the element body by performing main firing on the pre-fired element body at a temperature of 1100° C. or lower.

According to a second aspect of the present invention, there is provided a multilayer piezoelectric element production method for producing a multilayer piezoelectric element comprising an element body wherein piezoelectric layers and internal electrode layers are alternately stacked, wherein the piezoelectric layer is composed of a piezoelectric ceramic, wherein the piezoelectric ceramic includes a compound oxide having the perovskite structure, wherein the compound oxide mainly contains lead, zirconium, titanium, zinc and niobium, including the steps of:

producing a piezoelectric layer ceramic green sheet by using a material mixture of a 90%-cummulated particle diameter of 1 μm or less, containing compounds of lead, zirconium, titanium, zinc and niobium;

forming a pre-fired element body by alternately stacking the produced piezoelectric layer ceramic green sheets and internal electrode precursor layers; and forming the element body by performing main firing on the pre-fired element body at a temperature of 1100° C. or lower.

According to a third aspect of the present invention, there is provided a multilayer piezoelectric element production method for producing a multilayer piezoelectric element comprising an element body wherein piezoelectric layers and internal electrode layers are alternately stacked, wherein-the piezoelectric layer is composed of a piezoelectric ceramic, wherein the piezoelectric ceramic includes a compound oxide having the perovskite structure, wherein the compound oxide mainly contains lead, zirconium, titanium, zinc, magnesium and niobium, including the steps of:

producing a piezoelectric layer ceramic green sheet by using a material mixture of a 90%-cummulated particle diameter of 1 μm or less, containing compounds of lead, zirconium, titanium, zinc, magnesium and niobium;

forming a pre-fired element body by alternately stacking the produced piezoelectric layer ceramic green sheets and internal electrode precursor layers; and forming the element body by performing main firing on the pre-fired element body at a temperature of 1100° C. or lower.

According to a fourth aspect of the present invention, there is provided a multilayer piezoelectric element production method for producing a multilayer piezoelectric element comprising an element body wherein piezoelectric layers and internal electrode layers are alternately stacked, wherein the piezoelectric layer is composed of a piezoelectric ceramic, wherein the piezoelectric ceramic includes a compound oxide having the perovskite structure, wherein the compound oxide mainly contains lead, zirconium, titanium, zinc and niobium and at least one kind selected from barium, strontium and calcium, including the steps of:

producing a piezoelectric layer ceramic green sheet by using a material mixture of a 90%-cummulated particle diameter of 1 μm or less, containing compounds of lead, zirconium, titanium, zinc and niobium and at least one kind of compound selected from barium, strontium and calcium;

forming a pre-fired element body by alternately stacking the produced piezoelectric layer ceramic green sheets and internal electrode precursor layers; and forming the element body by performing main firing on the pre-fired element body at a temperature of 1100° C. or lower.

According to a fifth aspect of the present invention, there is provided a multilayer piezoelectric element production method for producing a multilayer piezoelectric element comprising an element body wherein piezoelectric layers and internal electrode layers are alternately stacked, wherein the piezoelectric layer is composed of a piezoelectric ceramic, wherein the piezoelectric ceramic includes a compound oxide having the perovskite structure, wherein the compound oxide mainly contains lead, zirconium, titanium, zinc, magnesium and niobium and at least one kind selected from barium, strontium and calcium, including the steps of:

producing a piezoelectric layer ceramic green sheet by using a material mixture of a 90%-cummulated particle diameter of 1 μm or less, containing compounds of lead, zirconium, titanium, zinc, magnesium and niobium and at least one kind of compound selected from barium, strontium and calcium;

forming a pre-fired element body by alternately stacking the produced piezoelectric layer ceramic green sheets and internal electrode precursor layers; and forming the element body by performing main firing on the pre-fired element body at a temperature of 1100° C. or lower.

According to a sixth aspect of the present invention, there is provided a multilayer piezoelectric element production method for producing a multilayer piezoelectric element comprising an element body wherein piezoelectric layers and internal electrode layers are alternately stacked, wherein the piezoelectric layer is composed of a piezoelectric ceramic, wherein the piezoelectric ceramic includes a main component and a subcomponent, wherein the main component includes a compound oxide having the perovskite structure, wherein the compound oxide contains at least lead, zirconium and titanium, and the subcomponent includes at least one kind of oxide selected from steel, nickel, copper and cobalt, and a content of the subcomponent is 0.01 to 0.8 wt % in a conversion of oxides ($Fe_2O_3$, NiO, CuO and CoO) with respect to a weight of 1 mol of the main component, including the steps of:

producing a piezoelectric layer ceramic green sheet by using a material mixture of a 90%-cummulated particle diameter of 1 μm or less, containing compounds of at least lead, zirconium and titanium;

forming a pre-fired element body by alternately stacking the produced piezoelectric layer ceramic green sheets and internal electrode precursor layers; and forming the element body by performing main firing on the pre-fired element body at a temperature of 1100° C. or lower.

According to a seventh aspect of the present invention, there is provided a multilayer piezoelectric element production method for producing a multilayer piezoelectric element comprising an element body wherein piezoelectric layers and internal electrode layers are alternately stacked, wherein the piezoelectric layer is composed of a piezoelectric ceramic, wherein the piezoelectric ceramic includes a compound oxide having the perovskite structure, wherein the compound oxide contains at least lead, zirconium and titanium, including the steps of:

producing a piezoelectric layer ceramic green sheet by using a material mixture of a 90%-cummulated particle diameter of 1 μm or less, containing compounds of at least lead, zirconium and titanium;

forming a through hole on the produced piezoelectric layer ceramic green sheets and filling a connection wire material mixture in the through hole;

forming a pre-fired element body by alternately stacking the filled ceramic green sheets and internal electrode precursor layers; and forming the element body by performing main firing on the pre-fired element body at a temperature of 1100° C. or lower.

According to an eighth aspect of the present invention, there is provided a multilayer piezoelectric element production method for producing a multilayer piezoelectric element comprising an element body wherein piezoelectric layers and internal electrode layers are alternately stacked, wherein the piezoelectric layer is composed of a piezoelectric ceramic, wherein the piezoelectric ceramic includes a compound oxide having the perovskite structure, wherein the compound oxide mainly contains lead, zirconium, titanium, zinc and niobium, including the steps of:

producing a piezoelectric layer ceramic green sheet by using a material mixture of a 90%-cummulated particle diameter of 1 μm or less, containing compounds of lead, zirconium, titanium, zinc and niobium;

forming a through hole on the produced piezoelectric layer ceramic green sheets and filling a connection wire material mixture in the through hole;

forming a pre-fired element body by alternately stacking the filled ceramic green sheets and internal electrode precursor layers; and forming the element body by performing main firing on the pre-fired element body at a temperature of 1100° C. or lower.

According to a ninth aspect of the present invention, there is provided a multilayer piezoelectric element production method for producing a multilayer piezoelectric element comprising an element body wherein piezoelectric layers and internal electrode layers are alternately stacked, wherein the piezoelectric layer is composed of a piezoelectric ceramic, wherein the piezoelectric ceramic includes a compound oxide having the perovskite structure, wherein the compound oxide mainly contains lead, zirconium, titanium, zinc, magnesium and niobium, including the steps of:

producing a piezoelectric layer ceramic green sheet by using a material mixture of a 90%-cummulated particle diameter of 1 μm or less, containing compounds of lead, zirconium, titanium, zinc, magnesium and niobium;

forming a through hole on the produced piezoelectric layer ceramic green sheets and filling a connection wire material mixture in the through hole;

forming a pre-fired element body by alternately stacking the filled ceramic green sheets and internal electrode precursor layers; and forming the element body by performing main firing on the pre-fired element body at a temperature of 1100° C. or lower.

According to a tenth aspect of the present invention, there is provided a multilayer piezoelectric element production method for producing a multilayer piezoelectric element comprising an element body wherein piezoelectric layers and internal electrode layers are alternately stacked, wherein the piezoelectric layer is composed of a piezoelectric ceramic, wherein the piezoelectric ceramic includes a compound oxide having the perovskite structure, wherein the compound oxide mainly contains lead, zirconium, titanium, zinc and niobium and at least one kind selected from barium, strontium and calcium, including the steps of:

producing a piezoelectric layer ceramic green sheet by using a material mixture of a 90%-cummulated particle diameter of 1 μm or less, containing compounds of lead, zirconium, titanium, zinc and niobium and at least one kind of compound selected from barium, strontium and calcium;

forming a through hole on the produced piezoelectric layer ceramic green sheets and filling a connection wire material mixture in the through hole;

forming a pre-fired element body by alternately stacking the filled ceramic green sheets and internal electrode precursor layers; and forming the element body by performing main firing on the pre-fired element body at a temperature of 1100° C. or lower.

According to an eleventh aspect of the present invention, there is provided a multilayer piezoelectric element production method for producing a multilayer piezoelectric element comprising an element body wherein piezoelectric layers and internal electrode layers are alternately stacked, wherein the piezoelectric layer is composed of a piezoelectric ceramic, wherein the piezoelectric ceramic includes a compound oxide having the perovskite structure, wherein the compound oxide mainly contains lead, zirconium, titanium, zinc, magnesium and niobium and at least one kind selected from barium, strontium and calcium, including the steps of:

producing a piezoelectric layer ceramic green sheet by using a material mixture of a 90%-cummulated particle diameter of 1 μm or less, containing compounds of lead, zirconium, titanium, zinc, magnesium and niobium and at least one kind of compound selected from barium, strontium and calcium;

forming a through hole on the produced piezoelectric layer ceramic green sheets and filling a connection wire material mixture in the through hole;

forming a pre-fired element body by alternately stacking the filled ceramic green sheets and internal electrode precursor layers; and forming the element body by performing main firing on the pre-fired element body at a temperature of 1100° C. or lower.

According to a twelfth aspect of the present invention, there is provided a multilayer piezoelectric element production method for producing a multilayer piezoelectric element comprising an element body wherein piezoelectric layers and internal electrode layers are alternately stacked, wherein the piezoelectric layer is composed of a piezoelectric ceramic, wherein the piezoelectric ceramic includes a main component and a subcomponent, wherein the main component includes a compound oxide having the perovskite structure, wherein the compound oxide contains at least lead, zirconium and titanium, and the subcomponent includes at least one kind of oxide selected from steel, nickel, copper and cobalt, and a content of the subcomponent is 0.01 to 0.8 wt % in a conversion of oxides ($Fe_2O_3$, CoO, NiO and CuO) with respect to a weight of 1 mol of the main component, including the steps of:

producing a piezoelectric layer ceramic green sheet by using a material mixture of a 90%-cummulated particle diameter of 1 μm or less, containing compounds of at least lead, zirconium and titanium;

forming a through hole on the produced piezoelectric layer ceramic green sheets and filling a connection wire material mixture in the through hole;

forming a pre-fired element body by alternately stacking the filled piezoelectric layer ceramic green sheets and internal electrode precursor layers; and forming the element body by performing main firing on the pre-fired element body at a temperature of 1100° C. or lower.

In the sixth and twelfth aspects of the present invention, it is preferable to use a material mixture including subcomponent materials containing at least one kind of compound selected from steel, nickel, copper and cobalt corresponding to the oxides to be contained in the subcomponent other than main component materials containing compounds of at least lead, zirconium and titanium.

In the first to twelfth aspects, it is preferable to further include the step of forming an electrode on a surface of the element body.

According to the production methods of the piezoelectric element and multilayer piezoelectric element of the present invention, the firing temperature at the time of main firing can be set low because the production methods of the piezoelectric ceramic of the present invention are used.

As a piezoelectric element produced by the respective methods as explained above, while it is not particularly limited, an actuator, a piezoelectric buzzer, a sounding body, a sensor, etc. can be mentioned. It is particularly preferable to be applied to an actuator. The used vibration mode is not particularly limited and any of the vibration modes, for example, vertical oscillation (d33) and longitudinally stretching oscillation (d31), etc. can be used.

DESCRIPTION OF THE PREFERRED EMBODIMENT

Below, the present invention will be explained based on embodiments shown in drawings.

First Embodiment

In the present embodiment, as an example of a piezoelectric element, a multilayer piezoelectric element (for example, a multilayer actuator element) shown in FIG. 1 will be explained.

Figure 1:
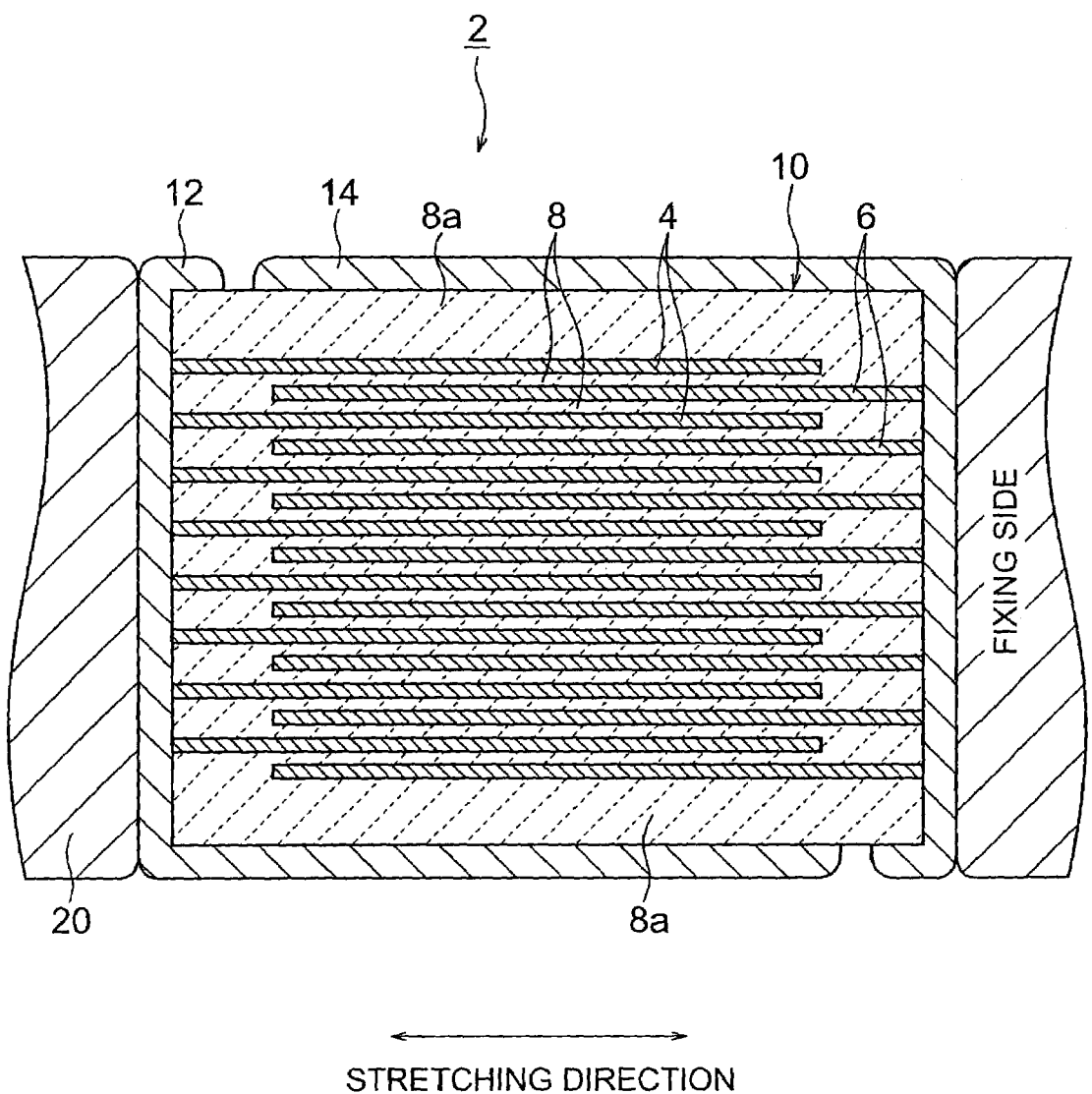
FIG. 1 is a cross-sectional view of a multilayer piezoelectric element according to a first embodiment of the present invention.

A multilayer piezoelectric element 2 shown in FIG. 1 is used by being arranged, for example, on the side of an object to be moved 20. The multilayer piezoelectric element 2 has an element body 10.

The element body 10 has the configuration wherein internal electrode layers 4 and 6 and interlayer piezoelectric layers 8 are stacked, furthermore, on both outer sides thereof in the stacking direction of the internal electrode layers 4 and 6 and the interlayer piezoelectric electrode layers 8 are arranged outer piezoelectric layers 8a. By arranging the outer piezoelectric layers 8a on both outer end portions in the stacking direction, inside of the element body 10 is protected.

A shape of the element body 10 is not particularly limited, but normally is rectangle. Also a size thereof is not particularly limited and may be a suitable size in accordance with use.

The internal electrode layers 4 and 6 stretch alternately in the opposite directions inside the element body 10, and the respective end surfaces are exposed to end portions of the element body 10. At the end portions of the element body 10 where the end surfaces of the internal electrode layers 4 and 6 are exposed are provided with a pair of external terminal electrodes 12 and 14. The external terminal electrode 12 is electrically connected to the internal electrode layers 4 and the other outer terminal electrode 14 is electrically connected to the other internal electrode layers 6. Also, the external terminal electrode 14 is partially extended toward the external terminal electrode 12 facing along the end surface of the interlayer piezoelectric layer 8 in the stacking direction. Namely, it is possible for a shown lead line to be connected to one side surface on the fixed side when used by fixing one surface of the stretching directions of the internal electrode layers 4 and 6. The external terminal electrodes 12 and 14 are, for example, electrically connected to a not shown external power source via the not shown lead line.

By applying a DC voltage or AC voltage to the external terminal electrodes 12 and 14, a voltage is applied to the interlayer piezoelectric layers 8 positioned between the internal electrode layers 4 and 6 and electric energy is converted to mechanical energy, so that the element 2 is displaced or oscillated in the horizontal or vertical direction with respect to a forming surface of the electrodes.

In actual, the element 2 is displaced or oscillated in the horizontal or vertical direction with respect to the polarizing direction of the interlayer piezoelectric layer 8. In the present embodiment, the element 2 is displaced in the vertical direction (in the right and left direction with respect to a paper surface of FIG. 1) with respect to the polarizing direction (in the up and down direction with respect to the paper surface).

The internal electrode layers 4 and 6 include a conductive material. The conductive material is not particularly limited but it is preferably composed of, for example, at least one kind of metal selected from Ag, Au, Pt and Pd or an alloy of two kinds thereof. Particularly in the present invention, since the interlayer piezoelectric layer 8 or the external piezoelectric layers 8a can be subjected to main firing at a low temperature of, for example, 1100° C. or lower, a relatively inexpensive material, such as Ag—Pd alloy having a small Pd content, can be used as the conductive material. The internal electrode layers 4 and 6 may contain a variety of trace of components, such as phosphorous (P), at a ratio of about 0.1 wt % or less. The thickness of the internal electrode layers 4 and 6 may be suitably determined in accordance with use, but it is preferably 0.5 to 3 µm or so. When the thickness of the internal electrode layers 4 and 6 is too thin, it is liable to break in the middle, consequently, a sufficient piezoelectric property cannot be obtained, while it is too thick, it is liable that warps of the element body 10 after firing become large.

The conductive material contained in the external terminal electrodes 12 and 14 is not particularly limited, and may be composed of at least one kind of metal selected from Ag, Au, Cu Ni, Pd and Pt or an alloy of two or more kinds thereof. The thickness of the external terminal electrodes 12 and 14 may be suitably determined in accordance with use, but is normally 10 to 50 µm or so.

The interlayer piezoelectric layers 8 and the external piezoelectric layer 8a contain the piezoelectric ceramic obtained from the production methods of the present invention.

The piezoelectric ceramic according to the first aspect has a main component including a compound oxide containing at least Pb, Zr and Ti. The compound oxide of the first aspect has the perovskite structure, wherein Pb positions at a so-called A site and Ti and Zr position at a so-called B site. The piezoelectric ceramic according to the first aspect preferably has configurations according to the second to sixth aspects.

The piezoelectric ceramic according to the second aspect has a main component including a compound oxide mainly including Pb, Zr, Ti, Zn and Nb. The compound oxide of the second aspect has the perovskite structure, wherein Pb positions at a so-called A site and Zn, Nb, Ti and Zr position at a so-called B site.

The compound oxide of the second aspect is preferably those expressed by a general formula (1) below.

$$Pb_{A1}[(Zn_{1/3} Nb_{2/3})_{a1} Ti_{b1} Zr_{c1}]O_3 \quad \text{formula (1)}$$

At this time, an amount of oxygen (O) may be a little different from the stoichiometric composition of the above formula.

In the above formula (1), when assuming that the composition mol ratio of an element positioned at the B site, that is $[(Zn_{1/3} Nb_{2/3})_{a1} Ti_{b1} Zr_{c1}]$, is 1, the mark A1 indicates the composition mol ratio of an element positioned at the A site, that is Pb. The value of the mark A1 tends to affect the sinterability. The mark A1 is 1 in the stoichiometric composition but it may not be the stoichiometric composition. In the present invention, the mark A1 is $0.99 \leq A1 \leq 1.01$, preferably $0.99 \leq A1 \leq 1.005$. It is because when the value of the mark A1 is too small, firing at a relatively low temperature is difficult and sintering at a low temperature of, for example, 1100° C. or lower becomes difficult. Inversely, when the value of the mark A1 is too large, the ceramic density declines, consequently, a sufficient piezoelectric property cannot be obtained.

In the above formula (1), the mark a1 indicates the composition mol ratio of $(Zn_{1/3} Nb_{2/3})$ in the B site. The value of the mark a1 tends to affect the firing temperature. In the present invention, the mark a1 is $0.05 \leq a1 \leq 0.25$, preferably $0.07 \leq a1 \leq 0.20$. When the value of the mark a1 is too small, an effect of lowering the firing temperature is not obtained, while when the value of the mark a1 is too large, sinterability is affected, consequently, a piezoelectric strain constant becomes small and mechanical strength is liable to decline.

The marks b1 and c1 in the above formula (1) indicate respective composition mol ratios of Ti and Zr in the B site. The values of the marks b1 and c1 tend to affect the piezoelectric property. In the present invention, the mark b1 is $0.35 \leq b1 \leq 0.5$, preferably $0.37 \leq b1 \leq 0.48$. The mark c1 is $0.38 \leq c1 \leq 0.48$, preferably $0.39 \leq c1 \leq 0.48$. By setting the values of the marks b1 and c1 within the ranges, a large piezoelectric strain constant can be obtained near the molphotropic phase boundary (MPB).

In the above formula (1), a total of the marks a1, b1 and c1 is $a1+b1+c1=1$.

Note that the composition of zinc and niobium in the above $(Zn_{1/3} Nb_{2/3})$ and the composition of oxygen are stoichiometrically obtained and may be deviated from the stoichiometric composition.

The piezoelectric ceramic according to the third aspect has a main component including a compound oxide mainly containing Pb, Zr, Ti, Zn, Mg and Nb. The compound oxide of the third aspect has the perovskite structure, wherein Pb positions at a so-called A site and Zn, Nb, Mg, Ti and Zr position at a so-called B site.

The compound oxide of the third aspect is preferably those expressed by a general formula (2) below.

$$Pb_{A2}[(Zn_{1/3} Nb_{2/3})_{a2} (Mg_{1/3} Nb_{2/3})_{d2} Ti_{b2} Zr_{c2}]O_3 \quad \text{formula (2)}$$

At this time, an amount of oxygen (O) may be a little different from the stoichiometric composition of the above formula.

In the above formula (2), when assuming that the composition mol ratio of an element positioned at the B site, that is $[(Zn_{1/3} Nb_{2/3})_{a2} (Mg_{1/3} Nb_{2/3})_{d2} Ti_{b2} Zr_{c2}]$, is 1, the mark A2 indicates the composition mol ratio of an element positioned at the A site, that is Pb. The value of the mark A2 tends to affect the sinterability. The mark A2 is the same as the mark A1 in the case of the second aspect explained above.

In the above formula (2), the mark a2 indicates the composition mol ratio of $(Zn_{1/3} Nb_{2/3})$ in the B site. The value of the mark a2 tends to affect a firing temperature. In the present invention, the mark a2 is $0.05 \leq a2 \leq 0.25$, preferably $0.07 \leq a2 \leq 0.20$. When the mark a2 is too small, an effect of lowering the firing temperature is not obtained, inversely, when the value of the mark a2 is too large, sinterability is affected, consequently, a piezoelectric strain constant becomes small and mechanical strength is liable to decline.

In the above formula (2), the mark d2 indicates the composition mol ratio of $(Mg_{1/3} Nb_{2/3})$ in the site B. The value of the mark d2 tends to affect the piezoelectric property. In the present invention, the mark d2 is $0.05 \leq d2 \leq 0.45$, preferably $0.07 \leq d2 \leq 0.35$.

In the above formula (2), a total of the marks a2 and d2 is $0.15 \leq (a2+d2) \leq 0.5$, preferably $0.15 \leq (a2+d2) \leq 0.4$. When the mark d2 and (a2+d2) are too small, effects of lowering the firing temperature and improving the piezoelectric property cannot be sufficiently obtained, while when the mark d2 and (a2+d2) are too large, a large amount of expensive niobium oxide is required, so the production costs become high, a pyrochlore phase which is a different phase is easy to be generated and synthesis tends to be difficult.

In the above formula (2), the marks b2 and c2 are the same as the marks b1 and c1 in the case of the second aspect explained above.

In the above formula (2), a total of the marks a2, b2, c2 and d2 is $a2+b2+c2+d2=1$.

Note that the composition of zinc and niobium in the $(Zn_{1/3} Nb_{2/3})$, the composition of magnesium and niobium in $(Mg_{1/3} Nb_{2/3})$ and the composition of oxygen explained above are stoichiometrically obtained and may be deviated from the stoichiometric composition.

The piezoelectric ceramic in the fourth aspect has a main component including a compound oxide mainly containing Pb, Zr, Ti, Zn and Nb, and at least one kind selected from Ba, Sr and Ca. The compound oxide of the fourth aspect has the perovskite structure, wherein Pb and at least one kind selected from Ba, Sr and Ca positions at a so-called A site and Zn, Nb, Ti and Zr position at a so-called B site.

The compound oxide of the fourth aspect is preferably those expressed by a general formula (3) below.

$$(Pb_{A1-B1} Me_{B1})[(Zn_{1/3} Nb_{2/3})_{a1} Ti_{b1} Zr_{c1}]O_3 \quad \text{formula (3)}$$

At this time, an amount of oxygen (O) may be a little different from the stoichiometric composition of the above formula.

In the above formula (3), the mark Me indicates at least one kind selected from Ba, Sr and Ca.

In the above formula (3), the composition mol ratio of the element $((Pb_{A1-B1} Me_{B1}))$ positioned at the A site with respect to the element $([(Zn_{1/3} Nb_{2/3})_{a1} Ti_{b1} Zr_{c1}])$ positioned at the B site is set to be 1. The composition mol ratio positioned at the A site is 1 in the stoichiometric composition, but it may not be the stoichiometric composition.

In the above formula (3), the mark A1 is 1 in the stoichiometric composition, but it may not be the stoichiometric composition. The value of the mark A1 tends to affect sinterability. In the present invention, the mark A1 is $0.99 \leq A1 \leq 1.01$, preferably $0.99 \leq A1 \leq 1.005$. When the value of the mark A1 is too small, firing at a relatively low temperature is difficult and, for example, sintering at a low temperature of 1100° C. or lower becomes difficult. Inversely, when the value of the mark A1 is too large, the ceramic density declines, consequently, a sufficient piezoelectric property cannot be obtained and the mechanical strength is liable to decline.

In the above formula (3), the mark B1 indicates the number of atoms of at least one kind of element selected from Ba, Sr and Ca in the A site. In the present invention, the mark B1 is $0 < B1 \leq 0.1$, preferably $0.005 \leq B1 \leq 0.1$. By making the value of the mark B1 larger than 0 and replacing a part of Pb by at least one element selected from Ca, Sr and Ba, the piezoelectric strain constant can be made large and the piezoelectric property can be improved. Specifically, for example, the piezoelectric strain constant (d31) of a rectangular stretching oscillation mode can be made 200 pC/N or more. Inversely, when the value of the mark B1 is too large, sinterability declines, as a result, it is liable that the piezoelectric strain constant becomes small, the mechanical strength declines and the Curie temperature lowers as the replacing amount increases.

In the above formula (3), the marks a1, b1 and c1 are the same as those in the case of the second aspect explained above.

The piezoelectric ceramic in the fifth aspect has a main component including a compound oxide mainly including Pb, Zr, Ti, Zn, Mg and Nb and at least one kind selected from Ba, Sr and Ca. The compound oxide of the fifth aspect has the perovskite structure, wherein Pb and at least one kind selected from Ba, Sr and Ca position at a so-called A site and Zn, Nb, Ti and Zr position at a so-called B site.

The compound oxide of the fifth aspect is preferably those expressed by a general formula (4) below.

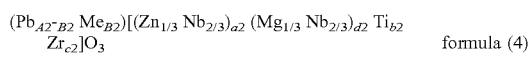

formula (4)

At this time, an amount of oxygen (O) may be a little different from the stoichiometric composition of the above formula.

In the above formula (4), the mark Me indicates at least one kind selected from Ba, Sr and Ca.

In the above formula (4), the composition mol ratio of the element $(Pb_{A2-B2} Me_{B2})$ positioned at the A site to the element $[(Zn_{1/3} Nb_{2/3})_{a2} (Mg_{1/3} Nb_{2/3})_{d2} Ti_{b2} Zr_{c2}]$ positioned at the B site is set to be 1. The composition mol ratio positioned at the A site is 1 in the stoichiometric composition, but it may not be the stoichiometric composition.

In the above formula (4), the mark A2 is the same as the mark A1 in the case of the fourth aspect explained above. In the above formula (4), the mark B2 is the same as the B1 in the case of the fourth aspect explained above. In the above formula (4), the marks a2, b2, c2 and d2 are the same as those in the case of the third aspect explained above.

The piezoelectric ceramic according to the sixth aspect further has a subcomponent including at least one kind of oxide selected from Fe, Ni, Cu and Co other than any one of the main components of the above second to fifth aspects. The subcomponent acts as a substance capable of lowering the firing temperature by heightening the sinterability.

In this case, a content of the above subcomponent is preferably 0.01 to 0.8 wt %, more preferably 0.05 to 0.6 wt % in a conversion of oxides ($Fe_2O_3$, CoO, NiO, CuO) with respect to a weight of 1 mol of the above main component. When the ratio of the subcomponent is too small, sinterability cannot be improved, while when too large, the sinterability tends to decline (that is, unable to be sintered). Note that the subcomponent is considered to be dissolved in the above oxide included in the main component and positioned at the B site.

Note that the number of layers, the thickness and other conditions of the interlayer piezoelectric layers 8 may be suitably determined in accordance with an object and use. In the present embodiment, the thickness of the interlayer piezoelectric layer 8 is for example 1 to 100 μm or so. The number of layers of the interlayer piezoelectric layer 8 is determined in accordance with an amount of displacement. The thickness of the outer piezoelectric layer 8a is for example 10 to 500 μm or so.

Production Method of Multilayer Piezoelectric Element

Next, an example of a method of producing a multilayer piezoelectric element 2 according to the present embodiment will be explained.

The multilayer piezoelectric element 2 is produced by preparing green chips by a normal printing method or a sheet molding method using a paste, firing the same, and printing or transferring thereon external terminal electrodes and firing the result. Below, a case of using the sheet molding method will be explained as an example.

Figure 2:
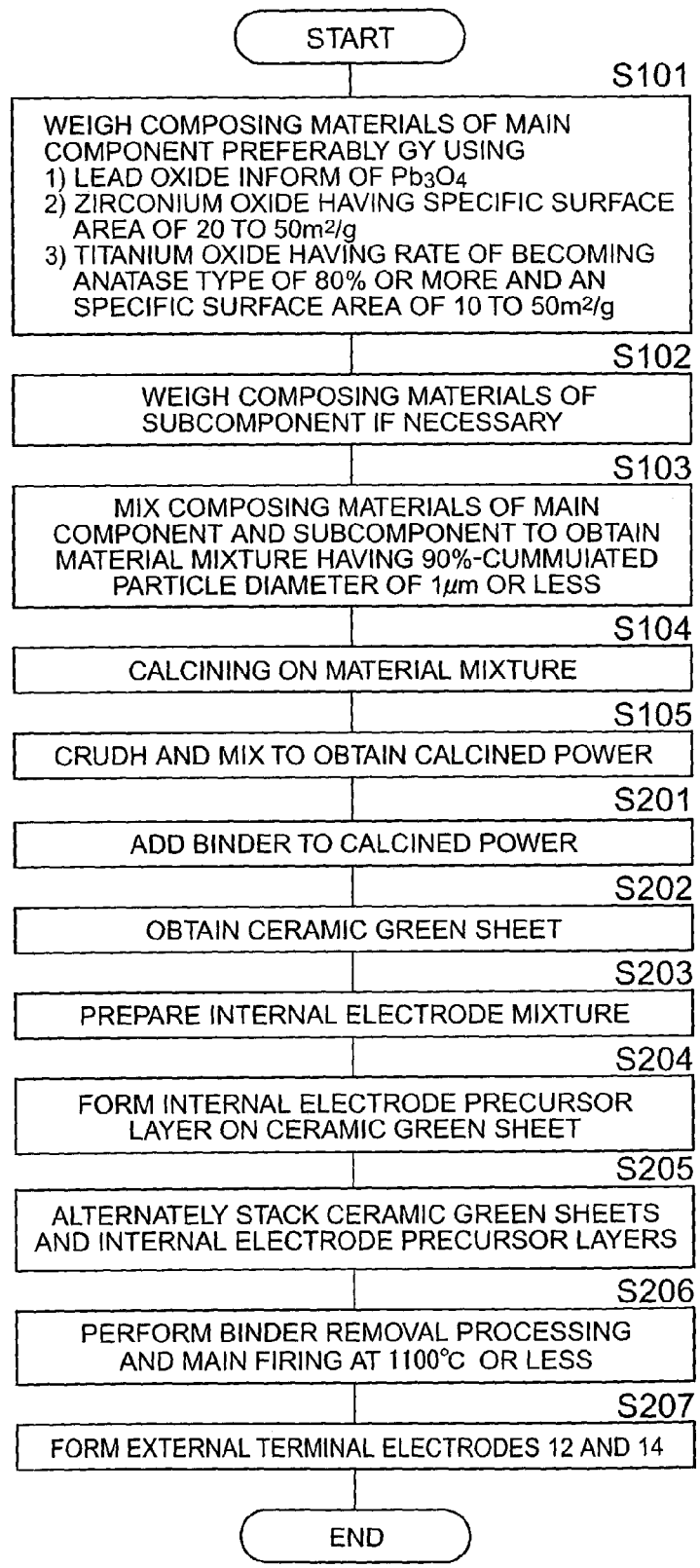
FIG. 2 is a flowchart of a flow of a method of producing the multilayer piezoelectric element in FIG. 1.

(1) As shown in FIG. 2, first, materials composing a main component are prepared in accordance with a composition of the above compound oxide and weighed (step S101). Next, in accordance with need, materials composing a subcomponent are prepared and weighed (step S102).

As materials composing the main component, compounds of Pb, compounds of Sr, compounds of Ca, compounds of Ba, compounds of Zn, compounds of Mg, compounds of Nb, compounds of Ti and compounds of Zr are used.

Among these, as a compound of Pb, it is preferable to use a lead oxide in a form of $Pb_3O_4$. The $Pb_3O_4$ normally has a specific surface area of 0.5 to 3 $m^2/g$. Note that the compounds of Pb also include PbO but the specific surface area thereof is normally 0.1 to 1.5 $m^2/g$, which is smaller comparing with that of $Pb_3O_4$. As a compound of Zr, it is preferable to use zirconium oxide having a specific surface area of 20 to 50 $m^2/g$. As a compound of Ti, titanium oxide having a rate of becoming an anatase type of 80% and a specific surface area of 10 to 50 $m^2/g$ is preferably used. By using these materials, in the later explained mixing step (refer to the step S103), the powders can be efficiently mixed, reactivity in the later explained calcining step (refer to step S104) becomes preferable and an main firing temperature can be made lower. Also, when the specific surface is too large, a cohesive force of the powders becomes strong, so that it becomes difficult to be dispersed in the mixing step, moreover, the volume becomes large and hard to be handled, and the material costs becomes expensive, which is not practical.

As materials composing the subcomponent, compounds of Fe, compounds of Ni, compounds of Cu and compounds of Co are used. By adding the materials composing the subcomponent, sinterability can be improved and the main firing temperature can be made lower.

Note that as the above compounds, oxides and/or compounds which become oxides by being fired can be mentioned. Also, as the compounds which become oxides by being fired, for example, carbonate, nitrate, oxalate, organic metallic compounds, etc. can be mentioned. These may be naturally used together with the compounds which become oxides by being fired.

The blending ratio of the above compounds may be determined so as to obtain the above composition of the piezoelectric ceramic after firing. The respective compounds (hereinafter, also referred to as material powders) having an average particle diameter of 0.5 to 10 µm or so are normally used.

(2) Next, material powders of the main component and the subcomponent are mixed to obtain a material mixture wherein a 90%-cumulated particle diameter in the particle size distribution is 1 µm or less (step S103).

A method of making the 90%-cumulated particle diameter of the material mixture 1 µm or less is not particularly limited and can be attained by optimizing a medium, slurry concentration, dispersant, grinding time, etc. by performing wet crushing and mixing using, for example, a ball-mill or bead-mill. Note that it may be attained by using a jet pulverizer.

Here, the "90%-cumulated particle diameter" means a particle diameter at which the cumulative frequency in the particle size distribution reaches 90%. The reason for adjusting the 90%-cumulated particle diameter as such is to lower the main firing temperature by improving the mixing degree of the material mixture by grinding and dispersing the material powders and making a solid phase reaction preferable in the calcining step (refer to the step S104). At this time, as far as those having the above specific surface areas are used as material powders of Zr and Ti, the solid-phase reaction in the calcining (refer to the step S104) becomes more preferable. Also, the 90%-cumulated particle diameter in the particle size distribution in the material mixture is preferably 0.2 µm or more. When it is smaller than that, a cohesion force of the material mixture becomes strong, so dispensability of the material declines and calcining reaction becomes not preferable.

Note that the material powders of the subcomponent may be added before or after the calcining (step S104). Note that it is preferable to add before the calcining since more homogenous piezoelectric ceramic can be produced. When adding after the calcining, it is preferable that an oxide is used as the material powders of the subcomponent.

(3) Next, the obtained material mixture is dried and subjected to calcining at the temperature of 750° C. to 950° C. for 2 to 6 hours (step S104). The calcining may be performed in the air, in an atmosphere having a high oxygen partial pressure than the air or in a pure oxygen atmosphere.

(4) Next, the obtained calcined result is subjected to wet crushing/mixing by using a ball-mill to obtain calcined powder including the main component and, in accordance with need, subcomponents (step S105). At this time, it is preferable to use water, ethanol or other alcohol, or mixed solvent of water and ethanol as a solvent of slurry. Fine crushing, such as wet crushing, is preferably performed until an average particle diameter of the calcined result becomes 0.5 to 2.0 µm or so.

(5) Next, by adding for example an acrylic acid resin base binder, etc. to the calcined powder, a calcined powder binder mixture is obtained (step S201).

(6) Next, the calcined powder binder mixture is molded to be a ceramic green sheet (step S202).

Preparing the above conductive materials or a variety of oxides, organic metallic compounds or resonates, etc. which become the above conductive materials after being fired, on which the internal electrode layers 4 and 6 shown in FIG. 1, and mixing the same with a binder to obtain an internal electrode material mixture (step S203). Note that the internal electrode material mixture may be added additives, such as a dispersant, plasticizer, dielectric material and insulation material in accordance with need.

(7) Next, an internal electrode precursor layer is formed, for example, by screen printing the internal electrode material mixture on the ceramic green sheet (step S204).

(8) Next, by alternately stacking the ceramic green sheets being formed the internal electrode precursor layer and the internal electrode precursor layers, a green chip as a precursor of the element body 10 is formed (step S205).

(9) Next, performing binder removal processing and main firing on the green chip to produce a sintered body (element body 10) (step S206).

The binder removal processing of the green chip may be performed under normal conditions and may be suitably determined in accordance with a kind of the conductive material in the internal electrode precursor layer. When using an Ag—Pd alloy including a small content of Pd as the conductive material, the binder removal processing may be performed in the air, in an atmosphere having a high oxygen partial pressure than the air or in a pure oxygen atmosphere. Furthermore, conditions of the binder removal processing other than that are preferably a holding temperature of 300 to 500° C. and a temperature holding time of 0.5 to 2 hours.

The main firing of the green chip is suitably determined in accordance with a kind of the conductive material in the internal electrode precursor layer, but when using an Ag—Pd alloy including a small content of Pd as the conductive material, the firing may be performed in the air, in an atmosphere having a high oxygen partial pressure than the air or in a pure oxygen atmosphere.

The main firing temperature of the green chip is suitably determined in a range that the green chip can be made sufficiently dense, a break of electrodes due to abnormal sintering of the internal electrode layers is not caused and a piezoelectric ceramic having the sufficient property can be obtained. It is because when the firing temperature is too low, the green chip cannot be made dense, while when too high, the internal electrodes break and a piezoelectric body having a sufficient piezoelectric property cannot be obtained.

Conventionally, firing at a relatively high temperature of over 1100° C. has been necessary to make the green chip sufficiently dense, but in the present embodiment, the main firing can be performed for example at 1100° C. or lower, more preferably 1050° C. or lower, further preferably 1000° C. or lower since a specific material mixture is used. By performing firing at such a low temperature, an inexpensive silver-palladium alloy, etc. can be used as the internal electrode layers 4 and 6. Furthermore, damages of a firing furnace can be prevented and costs of maintenance, management and energy can be sufficiently suppressed. Note that the lower limit of the main firing temperature is preferably 850° C. or so.

Main firing conditions other than that are preferably a temperature raising rate of 50 to 300° C./hour, a temperature holding time of 1 to 4 hours and a temperature cooling rate of 200 to 400° C./hour.

Note that the binder removal processing and the main firing are preferably performed separately but they may be performed successively.

The thus obtained sintered body (element body 10) is subjected to end surface polishing, such as barrel polishing and sandblasting, and spattering of a metal, such as gold, so as to form the external terminal electrodes 12 and 14. Alternately, mixing a conductive material, such as silver, gold, copper, nickel, palladium and platinum, a variety of oxides, organic metallic compounds or resonates, which become the conductive material after being fired, with a binder to obtain a terminal electrode material mixture, printing or transferring the terminal electrode mixture and firing the result, the external terminal electrodes 12 and 14 are formed (step S207). Firing conditions of the terminal electrode material mixture are preferably, for example in case of silver, at 600 to 800° C. for 10 to 30 minutes or so in the air.

The thus produced multilayer piezoelectric element 2 shown in FIG. 1 is used by being arranged, for example, on the side of an object to be moved 20.

In the present embodiment, since a material mixture having a 90%-cummulated particle diameter of 1 μm or less is used to produce the interlayer piezoelectric layers 8 of the multilayer piezoelectric element 2, the mixing degree of the material mixture can be improved, a solid phase reaction at the time of calcining becomes preferable and the main firing temperature can be lowered, for example, to 1100° C. or less.

Particularly, when lead oxide in a form of $Pb_3O_4$ is used as a material powder of lead, when using zirconium oxide having a specific surface area of 20 to 50 $m^2/g$ as material powder of zirconium, or when using titanium oxide having a rate of becoming an anatase type of 80% and a specific surface area of 10 to 50 $m^2/g$ as material powder of titanium, crushing and mixing of the material powders can be effectively performed, reactivity at the time of calcining can be improved and the main firing temperature can be made lower.

Furthermore, by adding as a subcomponent at least one kind of element selected from a group of steel, nickel, copper and cobalt, in a range of 0.01 to 0.8 wt % in a conversion of oxides ($Fe_2O_3$, CoO, NiO, CuO) with respect to a weight of 1 mol of the main component, sinterability can be improved and the main firing temperature can be lowered, for example, to 1050° C. or lower.

The multilayer piezoelectric element 2 obtained by the present embodiment has a large piezoelectric strain constant, a sufficient density in spite of the low firing temperature, and strong mechanical strength. As a result, a relatively inexpensive material, such as an Ag—Pd alloy including a small content of Pd, can be used for the internal electrode layers 4 and 6 and productivity of the piezoelectric element is improved comparing with the conventional cases. Also, due to the strong mechanical strength, a thickness of each interlayer piezoelectric layer 8 can be made thinner, which is advantageous to make the element 2 compact.

Second Embodiment

Figure 3:
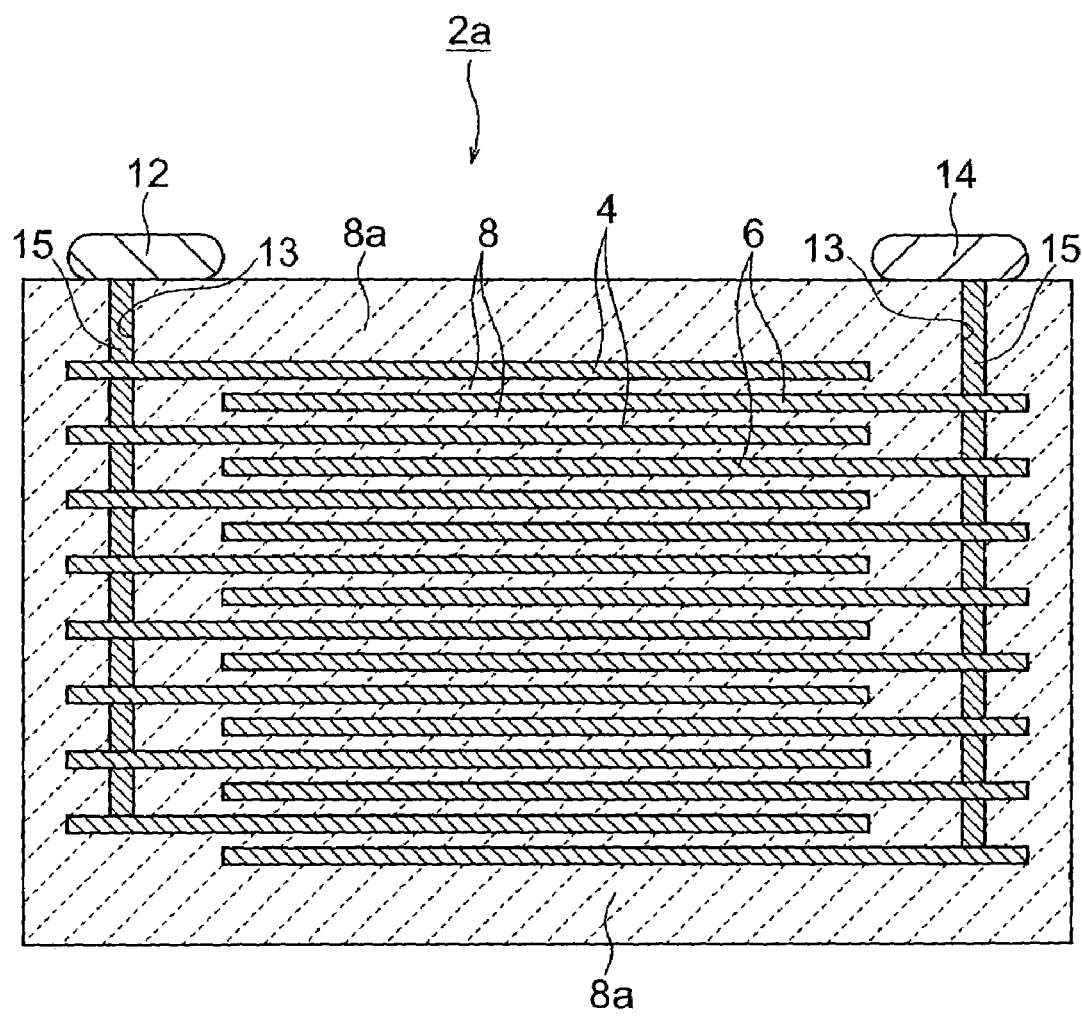
FIG. 3 is a cross-sectional view of a multilayer piezoelectric element according to a second embodiment of the present invention.

As shown in FIG. 3, a multilayer piezoelectric element 2a according to the present embodiment has the same configuration with that of the multilayer piezoelectric element 2 according to the first embodiment except that a connection method of the internal electrode layers 4 and 6 and the external terminal electrodes 12 and 14 is different. Accordingly, the same reference numbers are given to the same components and a detailed explanation will be omitted for the same portions here.

In the multilayer piezoelectric element 2a shown in FIG. 3, a through hole (via hole) 13 is formed on the interlayer piezoelectric layers 8 and the external piezoelectric layers 8a so as to penetrate in the stacking direction. A connection wire 15 is provided in the through hole 13 and the internal electrodes 4 and 6 and the external terminal electrodes 12 and 14 are electrically connected via the connection wire 15. The connection wire 15 is composed, for example, of the same material as the internal electrode layers 4 and 6.

The internal electrode layers 4 and 6 are not exposed to the end portion of the element body 10 and even if silver is contained therein, migration of silver can be suppressed.

Also, the external terminal electrodes 12 and 14 are provided so that one surface in the stacking direction is connected to the connection wire 15. Namely, comparing with the multilayer piezoelectric element 2 according to the first embodiment shown in FIG. 1, an area that the external terminal electrodes 12 and 14 cover the element body 10 is small, so even when arranging the element 2a on a not shown metal plate, its attachment is easy.

Next, an example of a method of producing the multilayer piezoelectric element 2a according to the present embodiment will be explained. In the present embodiment, a case of producing a green chip by a sheet molding method will be explained as an example.

Figure 4:
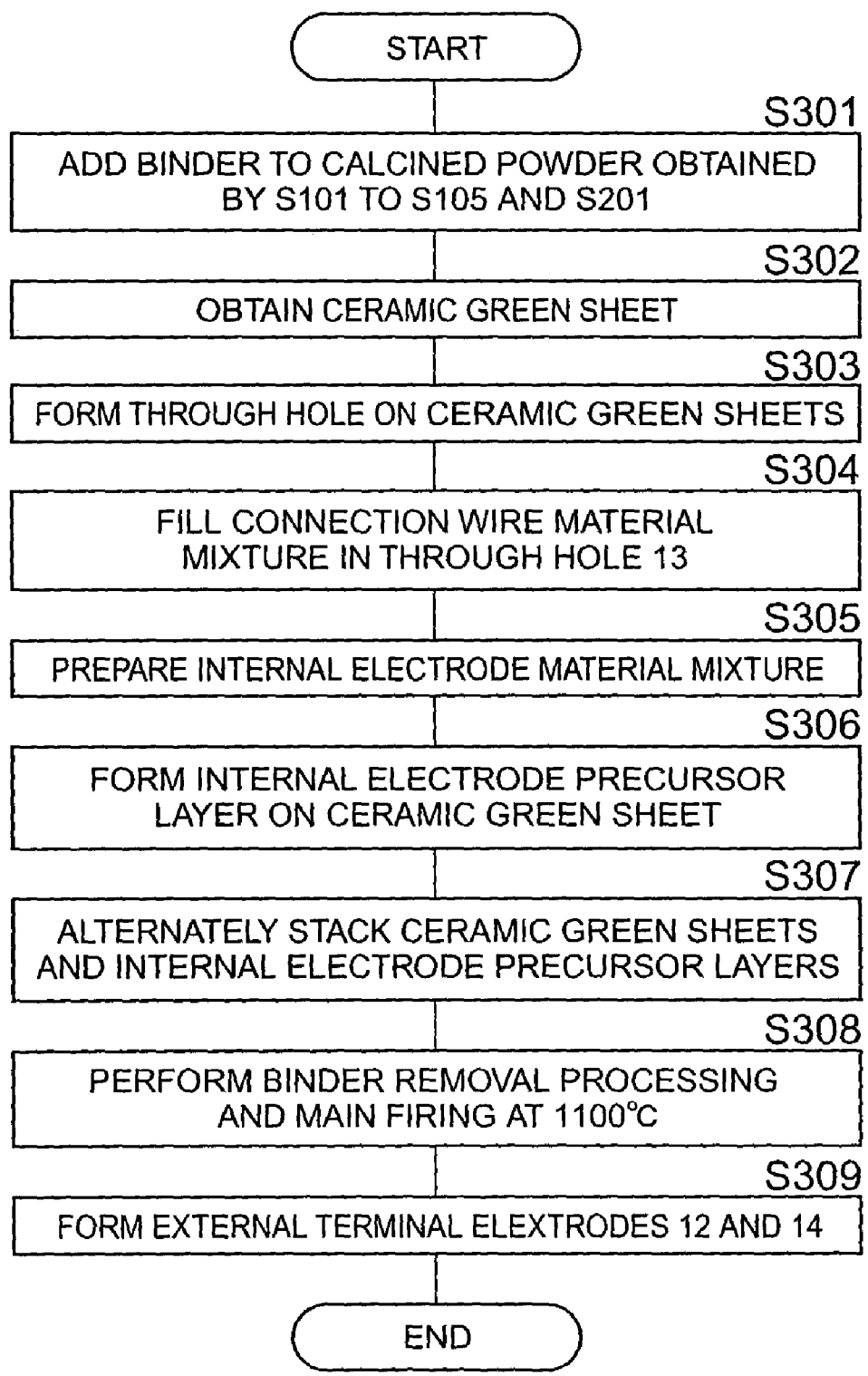
FIG. 4 is a flowchart of a flow of a method of producing the multilayer piezoelectric element in FIG. 3.

(1) As shown in FIG. 4, calcined powder is formed by following the steps S101 to S105 and S201 in the first embodiment, and a binder is added thereto to obtain a calcined powder binder mixture (step S301).

(2) Next, the calcined powder binder mixture is molded to obtain a ceramic green sheet (step S302).

(3) Next, a through hole 13 is formed on the ceramic green sheet (step S303).

(4) Next, a connection wire material mixture prepared in the same way as in the internal electrode material mixture of the first embodiment is filled in the through hole 13 (step S304).

(5) Next, the same internal electrode material mixture as that in the first embodiment is prepared (step S305), an internal electrode precursor layer is formed on the ceramic green sheets filled with the connection wire material mixture (step S306), the ceramic green sheets and the internal electrode precursor layers are alternately stacked (step S307), binder removal processing is performed and an main firing is performed to form a sintered body (element body 10) (step S308) (refer to the steps S203 to S206 in FIG. 2). The firing temperature is preferably low as, for example, 1100° C. or lower in the same way as in the first embodiment.

(6) Next, the external terminal electrodes 12 and 14 are formed on the element body 10 in the same way as in the first embodiment (step S309; refer to the step S207). As a result, the multilayer piezoelectric element 2a shown in FIG. 3 can be obtained.

According to the present embodiment, in the same way as in the first embodiment, a material mixture having a 90%-cummulated particle diameter of 1 μm or less is used for producing the interlayer piezoelectric layer 8 of the multilayer piezoelectric element 2a, the same effects as those in the first embodiment can be obtained.

Third Embodiment

Figure 5:
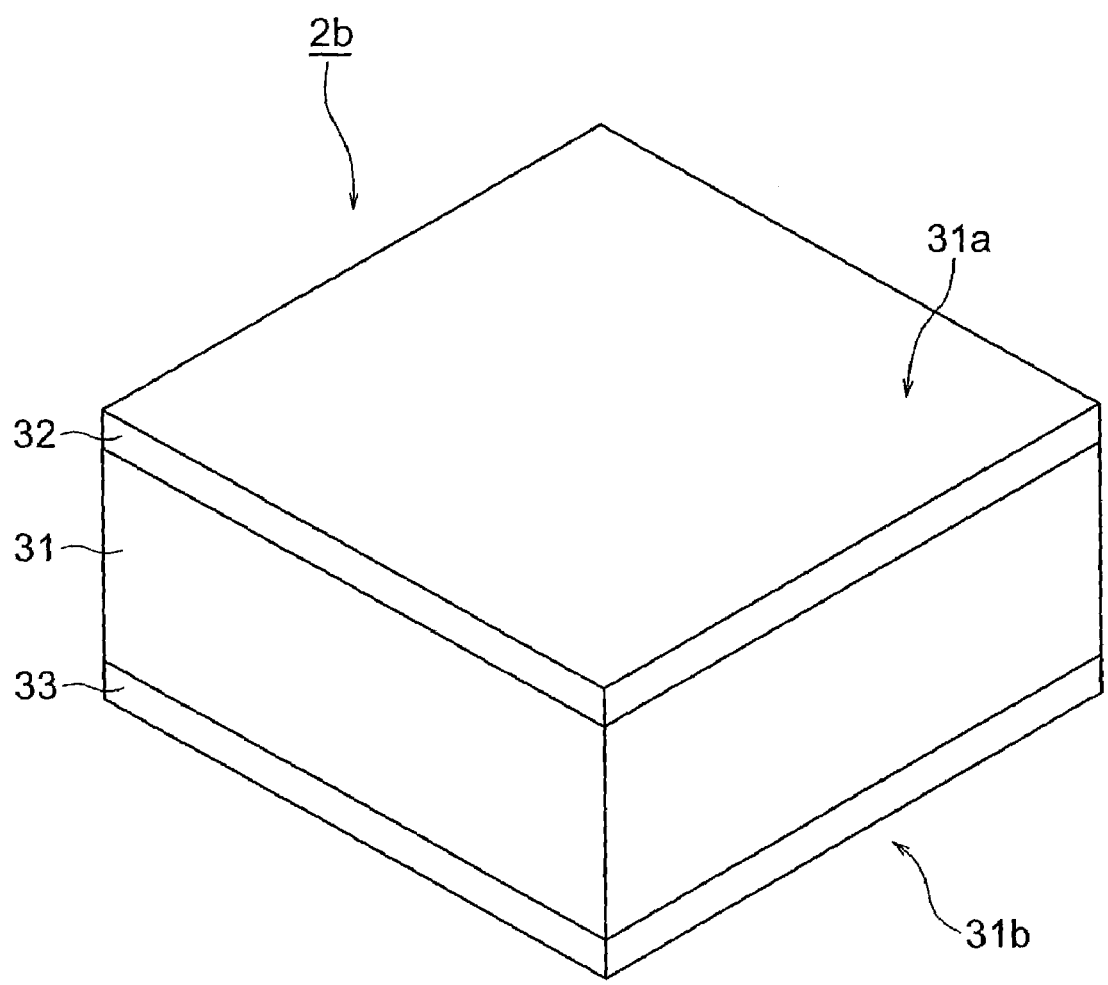
FIG. 5 is a cross-sectional view of a single-plate type piezoelectric element according to a third embodiment of the present invention.

In the present embodiment, a single plate type piezoelectric element shown in FIG. 5 will be taken as an example of a piezoelectric element. The single plate type piezoelectric element 2b shown in FIG. 5 comprises a piezoelectric substrate 31, a pair of electrodes 32 and 33 respectively provided on a pair of facing surfaces 31a and 31b of the piezoelectric substrate 31. The piezoelectric substrate 31 includes any one of the piezoelectric ceramics of the first embodiment. The electrodes 32 and 33 are respectively composed of gold and other metals and provided respectively on allover the facing surfaces 31a and 31b of the piezoelectric substrate 31. The electrodes 32 and 33 are electrically connected to a not shown external power source, for example, via a not shown lead line, etc.

Next, an example of a production method of the single plate type piezoelectric element $2b$ according to the present embodiment will be explained.

Figure 6:
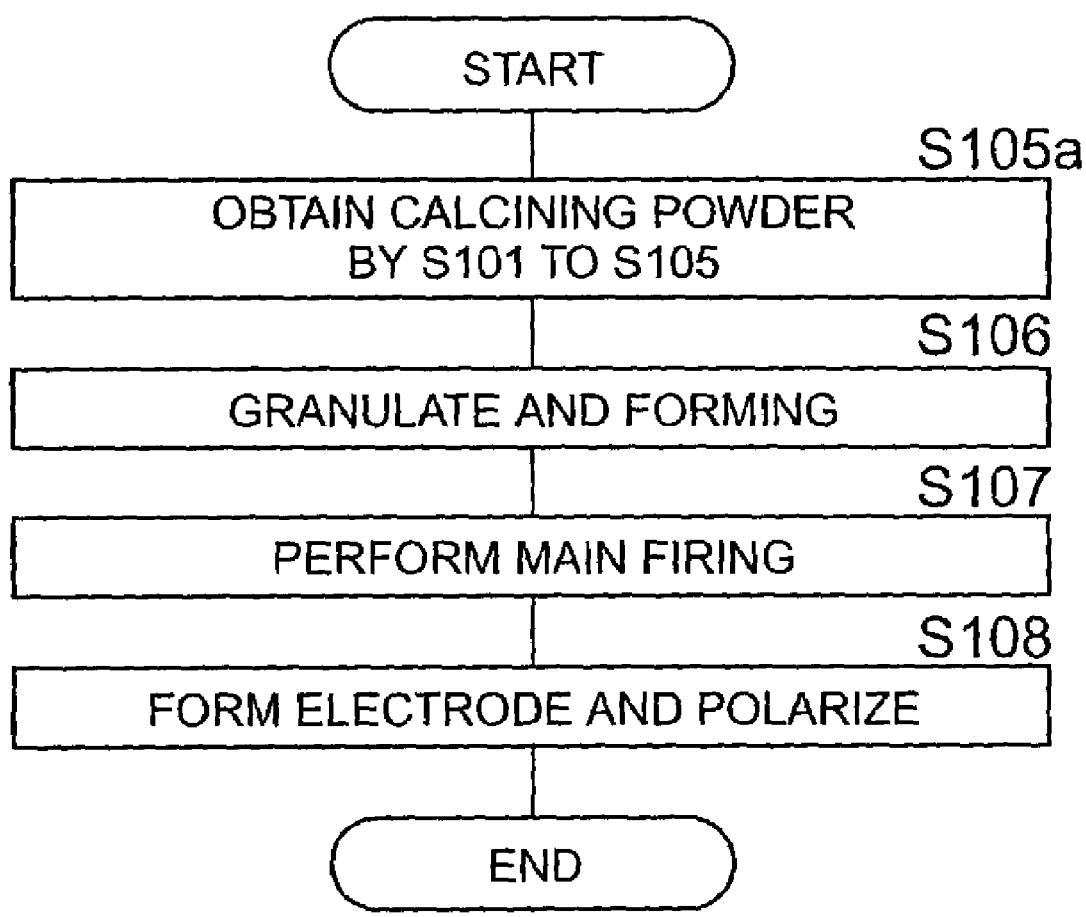
FIG. 6 is a flowchart of a flow of a method of producing the single layer piezoelectric element in FIG. 5.

(1) As shown in FIG. 6, first, a calcined powder is formed by following the steps S101 to S105 (step S105a).

(2) Next, the obtained calcined powder is dried, granulating by being added, for example, a polyvinyl alcohol base binder, and molded by using a uni-axial press machine or hydrostatic press molding machine (CIP) (step S106).

(3) Next, the obtained molded body is subjected to main firing for 2 to 6 hours in the air to obtain a sintered body (step S107). At this time, the main firing temperature is preferably low, for example, as 1100° C. or lower. It is because production equipments and production costs can be suppressed low.

(4) Next, the sintered body obtained by the main firing (the piezoelectric substrate 31) is polished in accordance with need, provided with the electrodes 32 and 33 and subjected to poling processing by being applied an electric field in a heated insulation oil (step S108). As a result, the single plate type piezoelectric element $2b$ shown in FIG. 5 can be obtained.

According to the present embodiment, since a material mixture having a 90%-cummulated particle diameter of 1 μm or less is used to produce the piezoelectric substrate 31 of the single plate piezoelectric element $2b$, the same effects as those in the first embodiment can be obtained.

Other Embodiment

An explanation was made on the embodiments of the present invention above, but the present invention is not limited to the embodiments and may be embodied in a variety of modes within the scope of the present invention.

For example, in the above embodiments, cases of producing piezoelectric ceramics mainly including the compound oxides expressed by the formulas (1) to (4) were explained, but the present invention can be also applied in the same way to the cases of producing piezoelectric ceramics mainly including compound oxides having the perovskite structure including elements other than those of lead, zirconium, titanium, zinc and niobium and, in accordance with need, magnesium, barium, strontium and calcium.

Also, in the above embodiments, the case of adding as subcomponent at least one kind of element selected from steel, nickel, copper and cobalt was explained, but other subcomponent may be included.

EXAMPLES

Below, the present invention will be explained based on further detailed examples, but the present invention is not limited to these. cl Examples 1—1 to 1-14

First, as starting materials, a chemically pure lead oxide (PbO), titanium oxide ($TiO_2$), zirconium oxide ($ZrO_2$), zinc oxide (ZnO), niobium oxide ($Nb_2O_5$), barium carbonate ($BaCO_3$), strontium carbonate ($SrCO_3$), calcium carbonate ($CaCO_3$), iron oxide ($Fe_2O_3$), cobalt oxide (CoO), nickel oxide (NiO) and copper oxide (CuO) are prepared and weighed (refer to the steps S101 and S102 in FIG. 2).

At this time, the blending ratios of the starting materials were adjusted so that the perovskite type compound oxide of the main component became the composition expressed in the formula (5) below. Note that coefficients in the formula (5) are mol fractions.

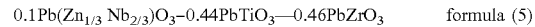

$$0.1Pb(Zn_{1/3}Nb_{2/3})O_3\text{--}0.44PbTiO_3\text{--}0.46PbZrO_3 \quad \text{formula (5)}$$

Also, an amount of adding the subcomponent was changed so that "r", "s", "t" and "u" shown in the formula (6) below became values shown in Table 1 in the examples 1—1 to 1-14. Note that the coefficients "r", "s", "t" and "u" in the formula (6) indicate weight % (indicated by "wt %" in Table 1) with respect to 1 mol of the main component.

$$rFe_2O_3+sCoO+tNiO+uCuO \quad \text{formula (6)}$$

Furthermore, in the examples 1-9 to 1-14, a part of the perovskite type compound oxide of the main component was made replaceable by barium, strontium or calcium and changed, so that "x", "y" and "z" expressed in the formula (7) below became values shown in Table 1. Note that the coefficients "x", "y" and "z" in the formula (7) are mol fractions.

$$xBa+ySr+zCa \quad \text{formula (7)}$$

Namely, the examples 1—1 to 1-8 correspond to the cases of mainly including the compound oxide expressed by the chemical formula (1) in the above embodiment, and the examples 1-9 to 1-14 correspond to the cases of mainly including the compound oxide expressed by the above chemical formula (2).

Also, a lead oxide in a form of PbO as explained above was used as a material powder of lead, titanium oxide having a rate of becoming an anatase type of 99% and a specific surface area of 10 $m^2/g$ was used as material powder of titanium, and zirconium oxide having a specific surface area of 20 $m^2/g$ was used as material powder of zirconium.

Successively, weighed starting materials were subjected to wet crushing and mixing by using a ball mill and a material mixture having a 90%-cummulated particle diameter of 0.9 to 1 μm was obtained (refer to the step S103 in FIG. 2). Note that the particle size (fineness) of the material mixture was measured by using a laser diffractive type microtrack. Then, the material mixture was dried and subjected to calcining at 750 to 950° C. for 2 to 6 hours (refer to the step S104 in FIG. 2).

After the calcining, the calcined result was subjected to wet crushing and mixing by using a ball mill (refer to the step S105 in FIG. 2), the obtained calcined powder was added a polyvinyl alcohol base binder and granulated, and molded with a pressure of about 196 MPa to be a box shape having a side length of about 20 mm and a thickness of about 1.5 mm (refer to the step S106 in FIG. 6). After the molding, the molded body was subjected to main firing at 1050° C. or 1100° C. as shown in Table 1 for 2 to 6 hours in the air (refer to the step S107 in FIG. 6).

After that, the obtained sintered body was processed to have a height of 1 mm, being formed silver printing electrodes, processed to be 12 mm×3 mm, and subjected to poling processing under conditions of a voltage of 2 to 3 kV/mm for 30 minutes in an insulation oil at 120° C. (refer to the step S108 in FIG. 6). As a result, piezoelectric ceramics of the examples 1—1 to 1-14 were obtained.

The ceramic density ρS of the obtained piezoelectric ceramics of the examples 1—1 to 1-14 was obtained by the Archimedes method. Also, an element electrostatic capacity c, resonance frequency fr and antiresonance frequency fa were measured by an impedance analyzer and a piezoelectric strain constant $d_{31}$ was obtained from the results. The results are shown in Table 1.

As comparative examples 1—1 to 1-14 for the present examples, piezoelectric ceramics were produced in the same way as in the present examples except that the material powder was mixed only to an extent that the 90%-cummulated particle diameter of the material mixture is more than 1 μm and that the main firing temperature was 1100° C. as shown in Table 1.

Note that the comparative examples 1—1 to 1-14 were made to have the same composition as that of the examples having respectively corresponding numbers. The ceramic density ρS and the piezoelectric strain constant $d_{31}$ were measured also on the comparative examples 1—1 to 1-14 in the same way as in the present examples. The results are also shown in Table 1.

cummulated particle diameter of the material mixture became over 1 μm or so, the ceramic density ρS was smaller than 7.8 Mg/m$^3$ and the piezoelectric strain constant $d_{31}$ was unmeasurable. It is because the ceramic density ρS was low and poling was impossible. Namely, it was found that when the 90%-cummulated particle diameter of the material mixture was made to be 1 μm or less, the sufficient property could be obtained even if the main firing temperature was 1100° C. or lower.

Also, in the examples 1-2 to 1-8 being added a subcomponent, larger values were obtained in the ceramic density ρS and in the piezoelectric strain constant $d_{31}$ comparing with those in the respectively corresponding comparative examples 1-2 to 1-8. Furthermore, according to the

TABLE 1

| | | Composition | | | | | | | Main Firing | Ceramic Density | Piezoelectric Strain Constant |
|---|---|---|---|---|---|---|---|---|---|---|---|
| | | r Wt % | s Wt % | t Wt % | u Wt % | x mol | y mol | z mol | Temperature ° C. | ρs Mg/m$^3$ | $d_{31}$ pC/N |
| example | 1-1 | 0 | 0 | 0 | 0 | 0 | 0 | 0 | 1100 | 7.83 | 200 |
| comparative example | 1-1 | | | | | | | | 1100 | 6.98 | — |
| example | 1-2 | 0 | 0 | 0 | 0.01 | 0 | 0 | 0 | 1050 | 7.89 | 205 |
| comparative example | 1-2 | | | | | | | | 1100 | 7.55 | 145 |
| example | 1-3 | 0.2 | 0 | 0 | 0 | 0 | 0 | 0 | 1050 | 7.90 | 210 |
| comparative example | 1-3 | | | | | | | | 1100 | 7.57 | 150 |
| example | 1-4 | 0 | 0.2 | 0 | 0 | 0 | 0 | 0 | 1050 | 7.85 | 200 |
| comparative example | 1-4 | | | | | | | | 1100 | 7.46 | 140 |
| example | 1-5 | 0 | 0 | 0.4 | 0 | 0 | 0 | 0 | 1050 | 7.91 | 210 |
| comparative example | 1-5 | | | | | | | | 1100 | 7.55 | 150 |
| example | 1-6 | 0.2 | 0 | 0.2 | 0 | 0 | 0 | 0 | 1050 | 7.88 | 205 |
| comparative example | 1-6 | | | | | | | | 1100 | 7.50 | 145 |
| example | 1-7 | 0 | 0.1 | 0 | 0.1 | 0 | 0 | 0 | 1050 | 7.88 | 205 |
| comparative example | 1-7 | | | | | | | | 1100 | 7.52 | 145 |
| example | 1-8 | 0.5 | 0 | 0.5 | 0 | 0 | 0 | 0 | 1100 | 7.53 | 150 |
| comparative example | 1-8 | | | | | | | | 1100 | 7.30 | 135 |
| example | 1-9 | 0.2 | 0 | 0 | 0 | 0.07 | 0 | 0 | 1050 | 7.87 | 220 |
| comparative example | 1-9 | | | | | | | | 1100 | 7.50 | 150 |
| example | 1-10 | 0.2 | 0 | 0 | 0 | 0 | 0.05 | 0 | 1050 | 7.89 | 230 |
| comparative example | 1-10 | | | | | | | | 1100 | 7.55 | 155 |
| example | 1-11 | 0.2 | 0 | 0 | 0 | 0 | 0 | 0.02 | 1050 | 7.88 | 220 |
| comparative example | 1-11 | | | | | | | | 1100 | 7.51 | 150 |
| example | 1-12 | 0 | 0 | 0.4 | 0 | 0.03 | 0.02 | 0 | 1050 | 7.83 | 230 |
| comparative example | 1-12 | | | | | | | | 1100 | 7.52 | 150 |
| example | 1-13 | 0 | 0 | 0.4 | 0 | 0.12 | 0 | 0 | 1100 | 7.49 | 140 |
| comparative example | 1-13 | | | | | | | | 1100 | 6.85 | — |
| example | 1-14 | 0 | 0 | 0.4 | 0 | 0 | 0 | 0.005 | 1050 | 7.81 | 215 |
| comparative example | 1-14 | | | | | | | | 1100 | 7.45 | 145 |

As shown in Table 1, according to the example 1—1 which was mixed until the 90%-cummulated particle diameter of the material mixture became 0.9 to 1 μm, sufficient values, such as the ceramic density ρS of 7.8 Mg/m$^3$ or more and the piezoelectric strain constant $d_{31}$ of 200 pC/N or more, could be obtained even performing the main firing at 1100° C. Comparing with this, in the comparative example 1—1 which was mixed only to an extent that the 90%- examples 1-2 to 1-7, larger values were obtained in the ceramic density ρS and in the piezoelectric strain constant $d_{31}$ comparing with those in the example 1—1 not added with the subcomponent. Namely, it was found that when being added at least one kind of element among a group of steel, nickel, copper and cobalt in a range of 0.01 wt % or more and 0.8 wt % or less in a conversion of oxides with respect to a weight of 1 mol of the main component, the piezoelectric strain constant $d_{31}$ was able to be made large even when performing the main firing at a temperature of lower than 1050° C.

In addition to the above, as known by comparing the examples 1-3 with 1-9 to 1-11 or the examples 1-5 with 1-12 to 1-14, a larger piezoelectric strain constant $d_{31}$ was obtained when replacing a part of lead by other element in a range of 0.1 mol or less (excepting 0). Namely, it was found that when replacing a part of lead by at least one kind of element among a group of barium, strontium and calcium in a range of 0.1 mol or less (excepting 0), the piezoelectric strain constant $d_{31}$ was able to be made larger even when performing the main firing at a low temperature of 1100° C. or lower.

Examples 2-1 to 2-14

In addition to the same starting materials as in the examples 1—1 to 1-14, chemically pure magnesium carbonate ($MgCO_3$) was prepared. The blending ratio of the starting materials was adjusted so that the perovskite type compound oxide of the main component became the composition expressed in the formula (8) below. Note that coefficients in the formula (8) are mol fractions.

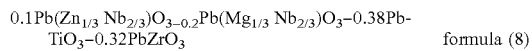
$0.1Pb(Zn_{1/3}Nb_{2/3})O_3 – 0.2Pb(Mg_{1/3}Nb_{2/3})O_3 – 0.38Pb\text{-}TiO_3 – 0.32PbZrO_3$  formula (8)

An amount of adding the subcomponent was changed so that "r", "s", "t" and "u" shown in the above formula (6) became the values shown in Table 2 in the examples 2-1 to 2-14. Furthermore, in the examples 2-9 to 2-14, a part of lead in the perovskite type compound oxide of the main component was made to be replaced by barium, strontium or calcium and changed so that "x", "y" and "z" in the formula (7) became the values shown in Table 2.

Namely, the examples 2-1 to 2-8 correspond to the cases of mainly including the compound oxide expressed by the chemical formula (3), and the examples 2-9 to 2-14 correspond to the cases of mainly including the compound oxide expressed by the chemical formula (4).

The main firing temperature was 1050° C. or 1100° C. as shown in Table 2, and except for that, piezoelectric ceramics were produced in the same way as in the examples 1—1 to 1-14.

Note that a lead oxide in a form of PbO was used as a material powder of lead, titanium oxide having a rate of becoming an anatase type of 99% and a specific surface area of 10 m²/g was used as material powder of titanium, zirconium oxide having a specific surface area of 20 m²/g was used as material powder of zirconium, and the 90%-cummulated particle diameter of the material mixture was made to be 0.9 to 1 μm.

Also, as comparative examples 2-1 to 2-14, piezoelectric ceramics were produced in the same way as in the present examples except that the starting materials were mixed only to an extent that the 90%-cummulated particle diameter of the material mixture became over 1 μm or so and the main firing temperature was 1100° C. as shown in Table 2. Note that the comparative examples 2-1 to 2-14 have the same composition as those of the examples-having the respectively corresponding numbers.

The ceramic density ρS and the piezoelectric strain constant $d_{31}$ were measured also on the examples 2-1 to 2-14 and comparative examples 2-1 to 2-14 in the same way as in the examples 1—1 to 1-14. The results are shown together in Table 2.

TABLE 2

| | | Composition | | | | | | | Main Firing | Ceramic density | Piezoelectric Strain Constant |
|---|---|---|---|---|---|---|---|---|---|---|---|
| | | r Wt % | s Wt % | t Wt % | u Wt % | x mol | y mol | z mol | Temperature ° C. | ρ s Mg/m³ | $d_{31}$ pC/N |
| example | 2-1 | 0 | 0 | 0 | 0 | 0 | 0 | 0 | 1100 | 7.80 | 230 |
| comparative example | 2-1 | | | | | | | | 1100 | 6.70 | — |
| example | 2-2 | 0 | 0 | 0 | 0.01 | 0 | 0 | 0 | 1050 | 7.85 | 230 |
| comparative example | 2-2 | | | | | | | | 1100 | 7.50 | 150 |
| example | 2-3 | 0.2 | 0 | 0 | 0 | 0 | 0 | 0 | 1050 | 7.85 | 240 |
| comparative example | 2-3 | | | | | | | | 1100 | 7.52 | 155 |
| example | 2-4 | 0 | 0.2 | 0 | 0 | 0 | 0 | 0 | 1050 | 7.81 | 225 |
| comparative example | 2-4 | | | | | | | | 1100 | 7.44 | 145 |
| example | 2-5 | 0 | 0 | 0.4 | 0 | 0 | 0 | 0 | 1050 | 7.88 | 245 |
| comparative example | 2-5 | | | | | | | | 1100 | 7.51 | 155 |
| example | 2-6 | 0.2 | 0.1 | 0 | 0 | 0 | 0 | 0 | 1050 | 7.86 | 235 |
| comparative example | 2-6 | | | | | | | | 1100 | 7.49 | 150 |
| example | 2-7 | 0 | 0 | 0.2 | 0.1 | 0 | 0 | 0 | 1050 | 7.87 | 235 |
| comparative example | 2-7 | | | | | | | | 1100 | 7.50 | 150 |
| example | 2-8 | 0.5 | 0 | 0.5 | 0 | 0 | 0 | 0 | 1100 | 7.50 | 160 |
| comparative example | 2-8 | | | | | | | | 1100 | 7.28 | 140 |
| example | 2-9 | 0 | 0 | 0.4 | 0 | 0.07 | 0 | 0 | 1050 | 7.82 | 265 |

TABLE 2-continued

| | | | | Composition | | | | | Main Firing Temperature °C. | Ceramic density ρ s Mg/m³ | Piezoelectric Strain Constant $d_{31}$ pC/N |
|---|---|---|---|---|---|---|---|---|---|---|---|
| | | r Wt % | s Wt % | t Wt % | u Wt % | x mol | y mol | z mol | | | |
| comparative example | 2-9 | | | | | | | | 1100 | 7.48 | 155 |
| example | 2-10 | 0 | 0 | 0.4 | 0 | 0 | 0.05 | 0 | 1050 | 7.87 | 270 |
| comparative example | 2-10 | | | | | | | | 1100 | 7.48 | 160 |
| example | 2-11 | 0 | 0 | 0.4 | 0 | 0 | 0 | 0.02 | 1050 | 7.81 | 265 |
| comparative example | 2-11 | | | | | | | | 1100 | 7.49 | 155 |
| example | 2-12 | 0.2 | 0 | 0 | 0 | 0.03 | 0.02 | 0 | 1050 | 7.80 | 270 |
| comparative example | 2-12 | | | | | | | | 1100 | 7.50 | 160 |
| example | 2-13 | 0.2 | 0 | 0 | 0 | 0.12 | 0 | 0 | 1100 | 7.50 | 145 |
| comparative example | 2-13 | | | | | | | | 1100 | 6.80 | — |
| example | 2-14 | 0.2 | 0 | 0 | 0 | 0 | 0 | 0.005 | 1050 | 7.88 | 245 |
| comparative example | 2-14 | | | | | | | | 1100 | 7.45 | 150 |

As shown in Table 2, according to the example 2-1 which was mixed until the 90%-cummulated particle diameter of the material mixture became 0.9 to 1 μm, sufficient values could be obtained, such as the ceramic density ρS of 7.8 Mg/m³ or more and the piezoelectric strain constant $d_{31}$ of 200 pC/N or more, even performing the main firing at 1100° C. as same as in the example 1—1. Comparing with this, in the comparative example 2-1 which was mixed only to an extent that the 90%-cummulated particle diameter of the material mixture became over 1 μm or so, the ceramic density ρS was smaller than 7.8 Mg/m³ and the piezoelectric strain constant $d_{31}$ was unmeasurable because poling was impossible. Namely, it was found also in the present examples that when the 90%-cummulated particle diameter of the material mixture was made to be 1 μm or less, the sufficient property could be obtained even if the main firing temperature was 1100° C. or lower.

Also, in the examples 2—2 to 2-8 to which a subcomponent was added, larger values were obtained in ceramic density ρS and in the piezoelectric strain constant $d_{31}$ comparing with those in the respectively corresponding comparative examples 2—2 to 2-8. Furthermore, according to the examples 2—2 to 2-7, even if the firing temperature was set as low as 1050° C., larger values were obtained in the ceramic density ρS and in the piezoelectric strain constant $d_{31}$ comparing with those in the example 2-1 not added with the subcomponent. Namely, also in the present examples, it was found that when being added at least one kind of element among a group of steel, nickel, copper and cobalt in a range of 0.01 wt % or more and 0.8 wt % or less in a conversion of oxides with respect to a weight of 1 mol of the main component, the piezoelectric strain constant $d_{31}$ was able to be made large even when performing the main firing at a temperature of lower than 1050° C.

In addition to the above, as known by comparing the examples 2-5 and 2-9 to 2-11 with the examples 2-3 and 2-12 to 2-14, a larger piezoelectric strain constant $d_{31}$ was obtained when replacing a part of lead by other element in a range of 0.1 mol or less (excepting 0). Namely, it was found that when replacing a part of lead by at least one kind of element among a group of barium, strontium and calcium in a range of 0.1 mol or less (excepting 0), the piezoelectric strain constant $d_{31}$ was able to be made larger even when performing the main firing at a low temperature of 1100° C. or lower.

Furthermore, as known by comparing the examples 2-1 to 2-5 with the examples 1—1 to 1-5 in Table 1, a larger piezoelectric strain constant $d_{31}$ was obtained in the examples 2-1 to 2-5 in which magnesium and niobium ($Mg_{1/3}$ $Nb_{2/3}$) was blended. Namely, it was found that when magnesium and niobium ($Mg_{1/3}$ $Nb_{2/3}$) were blended therein, a larger piezoelectric strain constant $d_{31}$ was obtained.

Examples 3-1 to 3—3 and Examples 4-1 to 4-3

As examples 3-1 to 3—3, piezoelectric ceramics were produced in the same way as in the example 1-3 except that the rate of becoming an anatase type and the specific surface area of the material powder $TiO_2$ of titanium were changed as shown in Table 3 and the main firing temperature was 1050° C. or 1100° C. as shown in Table 3. Also, as examples 4-1 to 4-3, piezoelectric ceramics were produced in the same way as in the example 2-3 except that the rate of becoming an anatase type and the specific surface area of the material powder $TiO_2$ of titanium were changed as shown in Table 4 and the main firing temperature was 1050° C. or 1100° C. as shown in Table 4. Note that a lead oxide in a form of PbO was used as a material powder of lead, zirconium oxide having a specific surface area of 20 m²/g was used as material powder of zirconium, and the 90%-cummulated particle diameter of the material mixture was made to be 0.9 to 1 μm.

As to the examples 3-1 to 3—3 and examples 4-1 to 4-3, the ceramic density ρS and the piezoelectric strain constant $d_{31}$ were respectively measured in the same way as in the examples 1-3 and 2-3. The results are shown in Table 3 and 4 together with the results of the examples 1-3 and 2-3.

TABLE 3

| | Material Powder of Ti (TiO2) | | | | |
|---|---|---|---|---|---|
| | Rate of Becoming Anatase % | Specific Surface Area $m^2/g$ | Main Firing Temperature °C. | Ceramic Density $\rho s$ $Mg/m^3$ | Piezoelectric Constant $d_{31}$ pC/N |
| example 1-3 | 99 | 10 | 1050 | 7.90 | 210 |
| example 3-1 | 80 | 15 | 1050 | 7.85 | 205 |
| example 3-2 | 70 | 15 | 1100 | 7.60 | 170 |
| example 3-3 | 99 | 6 | 1100 | 7.45 | 145 |

TABLE 4

| | Material Powder of Ti (TiO2) | | | | Piezoelectric |
|---|---|---|---|---|---|
| | Rate of Becoming Anatase | Specific Surface area $m^2/g$ | Main Firing Temperature °C. | Ceramic Density $\rho s$ $Mg/m^3$ | Strain Constant $d_{31}$ pC/N |
| example 2-3 | 99 | 10 | 1050 | 7.85 | 240 |
| example 4-1 | 80 | 15 | 1050 | 7.82 | 235 |
| example 4-2 | 70 | 15 | 1100 | 7.61 | 180 |
| example 4-3 | 99 | 8 | 1100 | 7.43 | 160 |

As shown in Table 3 and 4, in the examples 3-2 and 4-2 wherein the rate of becoming an anatase type was made smaller than 80% and in the examples 3—3 and 4-3 wherein the specific surface area was made smaller than 10 $m^2/g$, only insufficient values were obtained, such as the ceramic density $\rho S$ of less than 7.8 $Mg/m^3$ and the piezoelectric strain constant $d_{31}$ of less than 200 pC/N, even when the main firing temperature was 1100° C. Namely, by using titanium oxide wherein the rate of becoming an anatase type is 80% or more and the specific surface area is 10 $m^2/g$ or more as the material powder of titanium, the main firing temperature can be made lower.

Example 5-1 and Example 6-1

As an example 5-1, piezoelectric ceramics were produced in the same way as in the example 1-3 except that the specific surface area of the material powder $ZrO_2$ of zirconium was made to be 15 $m^2/g$ and the main firing temperature was made to be 1100° C.

Also, as an example 6-1, piezoelectric ceramics were produced in the same way as in the example 2-3 except that the specific surface area of the material powder $ZrO_2$ of zirconium was made to be 15 $m^2/g$ and the main firing temperature was made to be 1100° C. Note that a lead oxide in a form of PbO was used as a material powder of lead, titanium oxide having a rate of becoming an anatase type of 99% and a specific surface area of 10 $m^2/g$ was used as material powder of titanium, and the 90%-cummulated particle diameter of the material mixture was made to be 0.9 to 1 μm.

The ceramic density $\rho S$ and the piezoelectric strain constant $d_{31}$ were respectively measured on the example 5-1 and the example 6-1 in the same way as in the examples 1-3 and 2-3. The results are shown in Table 5 and Table 6 together with the results of the examples 1-3 and 2-3.

TABLE 5

| | Material Powder Zr ($ZrO_2$) Specific Surface Area $m^2/g$ | Main Firing Temperature °C. | Ceramic Density $\rho s$ $Mg/m^3$ | Piezoelectric Strain Constant $d_{31}$ pC/N |
|---|---|---|---|---|
| example 1-3 | 20 | 1050 | 7.90 | 210 |
| example 5-1 | 15 | 1100 | 7.50 | 150 |

TABLE 6

| | Material Powder of Zr ($ZrO_2$) Specific Surface Area $m^2/g$ | Main Firing Temperature °C. | Ceramic Density $\rho s$ $Mg/m^3$ | Piezoelectric Strain Constant $d_{31}$ pC/N |
|---|---|---|---|---|
| example 2-3 | 20 | 1050 | 7.85 | 240 |
| example 6-1 | 15 | 1100 | 7.43 | 165 |

As shown in Table 5 and Table 6, in the examples 5-1 and 6-1 wherein the specific surface area was made smaller than 20 $m^2/g$, only insufficient values were obtained, such as the ceramic density $\rho S$ of less than 7.8 $Mg/m^3$ and the piezoelectric strain constant $d_{31}$ of less than 200 pC/N, even when the main firing temperature was 1100° C. Namely, it was found that by using zirconium oxide wherein the specific surface area is 20 $m^2/g$ or more as the material powder of zirconium, the main firing temperature can be made lower.

Example 7-1 and Example 8-1

As an example 7-1, piezoelectric ceramics were produced in the same way as in the example 1-5 except that lead oxide ($Pb_3O_4$: the particle diameter distribution was 0.2 to 5 μm, an average particle diameter was 0.8 μm, the specific surface area was 1.1 $m^2/g$) was used as a material powder of lead and the main firing temperature was made to be 900° C.

Also, as an example 8-1, piezoelectric ceramics were produced in the same way as in the example 2-5 except that lead oxide ($Pb_3O_4$) was used as a material powder of lead and the main firing temperature was made to be 900° C. Note that a titanium oxide having a rate of becoming an anatase type of 99% and a specific surface area of 10 $m^2/g$ was used as material powder of titanium, zirconium oxide having the specific surface area of 20 $m^2/g$ was used as a material powder of zirconium, and the 90%-cummulated particle diameter of the material mixture was made to be 0.9 to 1 μm.

Also, as reference examples 7-1 and 8-1 of the examples 7-1 and 8-1, piezoelectric ceramics were produced in the same way as in the examples 7-1 and 8-1 except that a lead oxide (PbO: the particle diameter distribution was 0.8 to 15 μm, an average particle diameter was 5 μm, the specific surface area was 0.3 $m^2/g$) was used as a material powder of lead.

The ceramic density ρS and the piezoelectric strain constant $d_{31}$ were respectively measured on the examples 7-1 and 8-1 and the reference examples 7-1 and 8-1 in the same way as in the examples 1-5 and 2-5. The results are shown in Table 7 and Table 8 together with the results of the examples 1-5 and 2-5.

TABLE 7

| | Form of Lead Oxide as Material Powder of Pb | Main Firing Temperature °C. | Ceramic Density ρ s Mg/m³ | Piezoelectric Strain Constant $d_{31}$ pC/N |
|---|---|---|---|---|
| example 1-5 | PbO | 1050 | 7.91 | 210 |
| example 7-1 | $Pb_3O_4$ | 900 | 7.80 | 200 |
| reference 7-1 example | PbO | 900 | 6.11 | — |

TABLE 8

| | Form of Lead Oxide as Material Powder of Pb | Main Firing Temperature °C. | Ceramic Density ρ s Mg/m³ | Piezoelectric Strain Constant $d_{31}$ pC/N |
|---|---|---|---|---|
| example 2-5 | PbO | 1050 | 7.88 | 245 |
| example 8-1 | $Pb_3O_4$ | 950 | 7.81 | 230 |
| reference 8-1 example | PbO | 950 | 6.02 | — |

As shown in Table 7 and Table 8, according to the examples 7-1 and 8-1 using a lead oxide ($Pb_3O_4$), sufficient values were obtained, such as the ceramic density ρS of 7.8 Mg/m³ or more and the piezoelectric strain constant $d_{31}$ of 200 pC/N or more, even when the main firing temperature was as low as 900° C. Comparing with that, in the reference examples 7-1 and 8-1 using a lead oxide (PbO), the ceramic density ρS was less than 7.8 Mg/m³ and the piezoelectric strain constant $d_{31}$ was unable to be measured because poling was impossible when the main firing temperature was made low as 900° C. or 950° C. Namely, it was found that when lead oxide in a form of $Pb_3O_4$ as a material powder of lead, the main firing temperature was made low as 900° C.

Examples 9-1 and 9-2

Multilayer piezoelectric elements as shown in FIG. 1 (the example 9-1) and FIG. 3 (the example 9-2) were produced as explained in the above examples by using the same material mixture as in the example 2-3. Below, an explanation will be made by giving the same reference numbers to the corresponding components with reference to FIG. 1 and FIG. 3.

An outer shape of the element was length 30 mm×width 6 mm×thickness 0.36 mm or so, a thickness of one interlayer piezoelectric layer 8 was 30 μm, a thickness of one of internal electrode layers 4 and 6 was 1 μm to 2 μm, and the number of layers of the internal electrode layers 4 and 6 was 10. A material including palladium and silver at the weight ratio of Pd:Ag=2:8 was used as a metal component as a conductive material in the internal electrode layers 4 and 6, the main firing temperature was 1050° C., and a stabilizing time during the main firing was 3 hours. The external terminal electrodes 12 and 14 were formed by spattering gold. In the example 9-1, as shown in FIG. 1, the external terminal electrodes 12 and 14 and the internal electrode layers 4 and 6 were directly connected, while in the example 9-2, as shown in FIG. 3, the external terminal electrodes 12 and 14 and the internal electrode layers 4 and 6 were connected via the connection wire 15 provided inside the through hole 13.

Also, as a comparative example 9-1 of the present example, multilayer piezoelectric elements as shown in FIG. 1 were produced in the same way as in the example 9-1 except for using the same material mixture as that in the comparative example 2-3. Namely, conditions of the comparative example 9-1 is the same as those of the example 9-1 except for mixing the starting materials only to an extent that the 90%-cummulated particle diameter of the material mixture became over 1 μm.

Credibility test was conducted on the obtained examples 9-1 and 9-2 and the comparative examples 9-1 and 9-2. As the credibility test, a moisture resistant load test was conducted by measuring a resistance value of the element over time for 500 hours by applying a DC electric field of 1000 kV/m per a thickness of the interlayer piezoelectric layer 8 under a circumstance of a temperature at 60° C. and humidity of 90% RH. Ten piezoelectric ceramics having an initial resistant value of $1 \times 10^{10}$ Ω or more were prepared for each of the examples 9-1 and 9-2 and the comparative example 9-1, and those having the resistant value of $1 \times 10^6$ Ω or less after the test were judged to be defective and those having more than $1 \times 10^6$ Ω after the test were judged to be good. The results are shown in FIG. 7.

Figure 7:
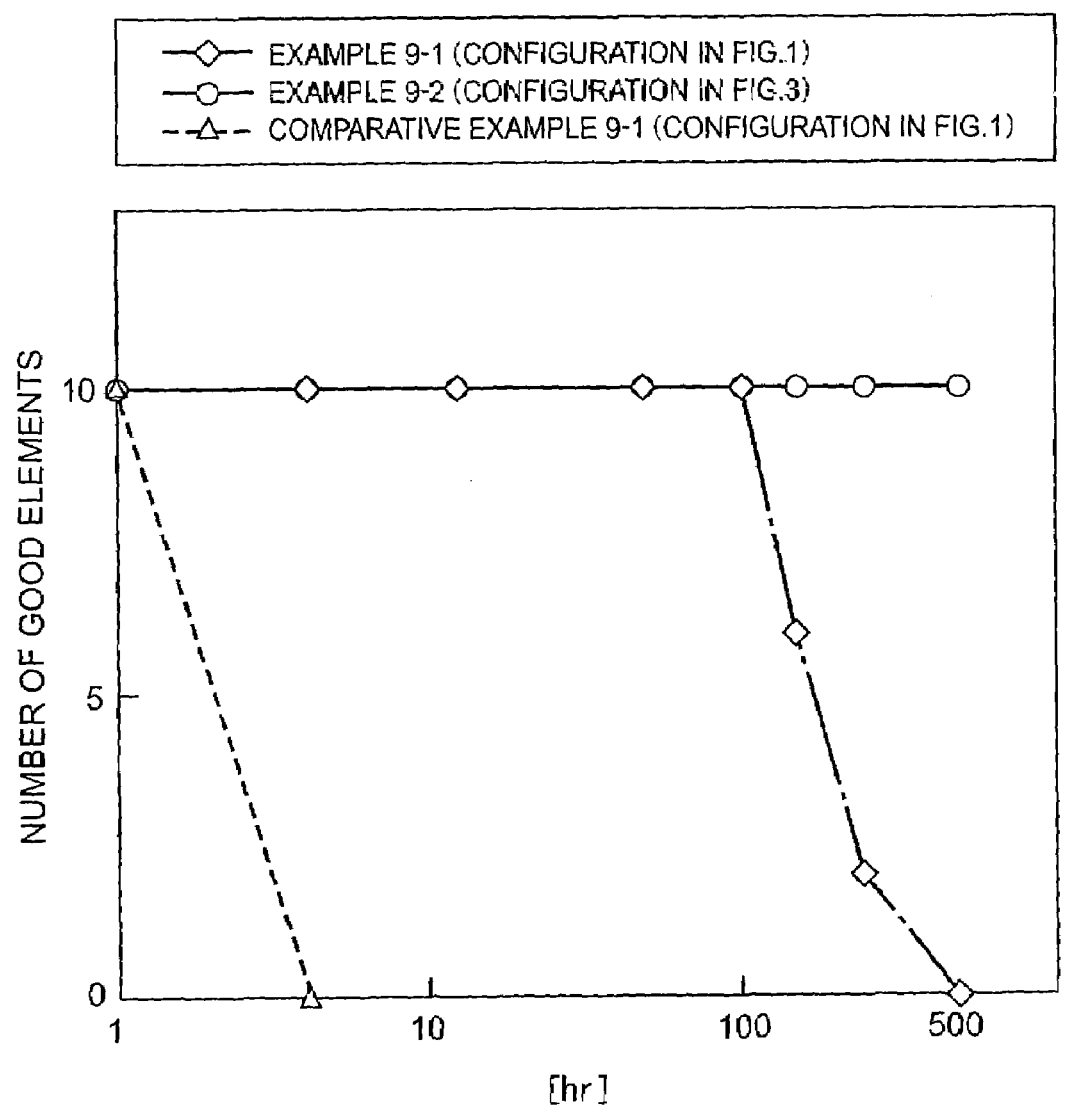
FIG. 7 is a view of characteristics of results of a credibility test in examples 9-1 and 9-2.

As shown in FIG. 7, in the examples 9-1 and 9-2, no defectives arose until 100 hours, and still no defectives arose after 500 hours in the example 9-2. On the contrary, in the comparative example 9-1, although it was possible to produce multilayer piezoelectric elements as shown in FIG. 1 on the outside, all elements became defective within 5 hours and the required property could not be obtained. The reason thereof is considered that sufficient sintering is possible even with the main firing temperature of 1050° C. in the examples 9-1 and 9-2, while sufficient sintering could not be obtained in the comparative example 9-1. Also, it is considered that the reason why the example 9-2 exhibited better results was because the internal electrodes were not exposed and migration of silver was hard to be caused.

Furthermore, when performing a displacement measurement of the elements by a laser Doppler type vibration meter on the piezoelectric elements of the examples 9-1 and 9-2, a piezoelectric strain constant $d_{31}$ equivalent to that of the example 2-3 shown in Table 2 was obtained in both cases.

Namely, it was found that when making the 90%-cummulated particle diameter of the material mixture is made to be 1 μm or less, sufficient properties were obtained even when the main firing temperature is 1050° C. or less.

Also, it was found that by connecting the internal electrode layers 4 and 6 and the external terminal electrodes 12 and 14 by using the through hole 13 as shown in FIG. 3, higher credibility could be obtained.

The invention claimed is:
1. A piezoelectric ceramic production method for producing a piezoelectric ceramic comprising:
   calcining said material mixture to obtain a calcined result;
   crushing said calcined result to obtain temporarily fired powder; and
   performing main firing on said calcined powder to obtain said piezoelectric ceramic composed of a sintered body,
      wherein the piezoelectric ceramic includes a compound oxide having a perovskite structure, the compound oxide contains at least lead, zirconium and titanium, said piezoelectric ceramic is produced by using a material mixture of a 90%-cummulated particle diameter of 1 μm or less, containing compounds of at least lead, zirconium and titanium, and a titanium oxide converts to an anatase type which is present at least 80% by weight % of the titanium oxide.

2. A piezoelectric ceramic production method for producing a piezoelectric ceramic comprising:
calcining said material mixture to obtain a calcined result;
crushing said calcined result to obtain temporarily fired powder; and
performing main firing on said calcined powder to obtain said piezoelectric ceramic composed of a sintered body, wherein the piezoelectric ceramic includes a compound oxide having a perovskite structure, the compound oxide mainly contains lead, zirconium, titanium, zinc and niobium, said piezoelectric ceramic is produced by using a material mixture of a 90%-cummulated particle diameter of 1 μm or less, containing compounds of lead, zirconium, titanium, zinc and niobium, and a titanium oxide converts to an anatase type which is present at least 80% by weight % of the titanium oxide.

3. A piezoelectric ceramic production method for producing a piezoelectric ceramic comprising:
calcining said material mixture to obtain a calcined result;
crushing said calcined result to obtain temporarily fired powder; and
performing main firing on said calcined powder to obtain said piezoelectric ceramic composed of a sintered body, wherein the piezoelectric ceramic includes a compound oxide having a perovskite structure, the compound oxide mainly contains lead, zirconium, titanium, zinc, magnesium and niobium, said piezoelectric ceramic is produced by using a material mixture of a 90%-cummulated particle diameter of 1 μm or less, containing compounds of lead, zirconium, titanium, zinc, magnesium and niobium, and a titanium oxide converts to an anatase type which is present at least 80% by weight % of the titanium oxide.

4. A piezoelectric ceramic production method for producing a piezoelectric ceramic comprising:
calcining said material mixture to obtain a calcined result;
crushing said calcined result to obtain temporarily fired powder; and
performing main firing on said calcined powder to obtain said piezoelectric ceramic composed of a sintered body, wherein the piezoelectric ceramic includes a compound oxide having a perovskite structure, the compound oxide mainly contains lead, zirconium, titanium, zinc and niobium, and at least one kind selected from barium, strontium and calcium, said piezoelectric ceramic is produced by using a material mixture of a 90%-cummulated particle diameter of 1 μm or less, containing compounds of lead, zirconium, titanium, zinc and niobium and at least one kind of compound selected from barium, strontium and calcium, and a titanium oxide converts to an anatase type which is present at least 80% by weight % of the titanium oxide.

5. A piezoelectric ceramic production method for producing a piezoelectric ceramic comprising:
calcining said material mixture to obtain a calcined result;
crushing said calcined result to obtain temporarily fired powder; and
performing main firing on said calcined powder to obtain said piezoelectric ceramic composed of a sintered body, wherein the piezoelectric ceramic includes a compound oxide having a perovskite structure, the compound oxide mainly contains lead, zirconium, titanium, zinc, magnesium and niobium, and at least one kind selected from barium, strontium and calcium, said piezoelectric ceramic is produced by using a material mixture of a 90%-cummulated particle diameter of 1 μm or less, containing compounds of lead, zirconium, titanium, zinc, magnesium and niobium and at least one kind of compound selected from barium, strontium and calcium, and a titanium oxide converts to an anatase type which is present at least 80% by weight % of the titanium oxide.

6. The piezoelectric ceramic production method as set forth in claim 2, wherein said compound oxide is expressed by a general formula $Pb_{A1}(Zn_{1/3}Nb_{2/3})_{a1}Ti_{b1}Zr_{c1}O_3$ and respective mol fractions in the formula are $0.99 \leq A1 \leq 1.01$, $0.05 \leq a1 \leq 0.25$, $0.2 \leq b1 \leq 0.5$ and $a1+b1+c1=1$.

7. The piezoelectric ceramic production method as set forth in claim 3, wherein said compound oxide is expressed by a general formula $Pb_{A2}(Zn_{1/3}Nb_{2/3})_{a2}(Mg_{1/3}Nb_{2/3})_{d2}Ti_{b2}Zr_{c2}O_3$ and respective mol fractions in the formula are $0.99 \leq A2 \leq 1.01$, $0.05 \leq a2 \leq 0.25$, $0.2 \leq b2 \leq 0.5$, $0.15 \leq (a2+d2) \leq 0.5$ and $a2+b2+c2+d2=1$.

8. The piezoelectric ceramic production method as set forth in claim 4, wherein said compound oxide is expressed by a general formula $(Pb_{A1-B1}Me_{B1})[(Zn_{1/3}Nb_{2/3})_{a1}Ti_{b1}Zr_{c1}]O_3$ and elements and respective mol fractions in the formula are Me=at least one kind of element selected from a group composed of Ba, Sr and Ca, $0.99 \leq A1 \leq 1.01$, $0 < B1 \leq 0.1$, $0.05 \leq a1 \leq 0.25$, $0.2 \leq b1 \leq 0.5$, and $a1+b1+c1=1$.

9. The piezoelectric ceramic production method as set forth in claim 5, wherein said compound oxide is expressed by a general formula $(Pb_{A2-B2}Me_{B2})[(Zn_{1/3}Nb_{2/3})_{a2}(Mg_{1/3}Nb_{2/3})_{d2}Ti_{b2}Zr_{c2}]O_3$ and elements and respective mol fractions in the formula are Me=at least one kind of element selected from a group composed of Ba, Sr and Ca, $0.99 \leq A2 \leq 1.01$, $0 < B2 \leq 0.1$, $0.05 \leq a2 \leq 0.25$, $0.2 \leq b2 \leq 0.5$, $0.15 \leq (a2+d2) \leq 0.5$ and $a2+b2+c2+d2=1$.

10. A piezoelectric ceramic production method for producing a piezoelectric ceramic comprising:
calcining said material mixture to obtain a calcined result;
crushing said calcined result to obtain temporarily fired powder; and
performing main firing on said calcined powder to obtain said piezoelectric ceramic composed of a sintered body, wherein the piezoelectric ceramic includes a compound oxide having a perovskite structure; the compound oxide including:
a main component containing at least lead, zirconium and titanium, and
a subcomponent containing at least one kind of oxide selected from steel, nickel, copper and cobalt, and
a content of said subcomponent is 0.01 to 0.8 wt % in a conversion of oxides ($Fe_2O_3$, CoO, NiO and CuO) with respect to a weight of 1 mol of said main component;
wherein said piezoelectric ceramic is produced by using a material mixture of a 90%-cummulated particle diameter of 1 μm or less, including main component materials containing compounds of at least lead, zirconium and titanium, and a titanium oxide converts to an anatase type which is present at least 80% by weight % of the titanium oxide.

11. The piezoelectric ceramic production method as set forth in claim 10, using the material mixture including a subcomponent materials containing at least one kind of compound selected from steel, nickel, copper and cobalt corresponding to said oxides to be contained in said subcomponent other than the main component materials containing compounds of at least lead, zirconium and titanium.

12. The piezoelectric ceramic production method as set forth in claim 1, wherein a lead oxide in a form of $Pb_3O_4$ is used as a compound of lead.

13. The piezoelectric ceramic production method as set forth in claim 1, wherein a zirconium oxide having a specific surface area of 20 to 50 $m^2/g$ is used as a compound of zirconium.

14. The piezoelectric ceramic production method as set forth in claim 1, wherein a specific surface area of 10 to 50 $m^2/g$ is used as a compound of titanium.

15. A piezoelectric element production method for producing a piezoelectric element, the method comprising:
calcining said material mixture to obtain a calcined result;
crushing said calcined result to obtain temporarily fired powder; and
performing main firing on said calcined powder to obtain said piezoelectric ceramic composed of a sintered body, wherein the piezoelectric element includes a piezoelectric layer, the piezoelectric layer is composed of a piezoelectric ceramic, the piezoelectric ceramic includes a compound oxide having a perovskite structure, and the compound oxide contains at least lead, zirconium and titanium, said piezoelectric ceramic is produced by using a material mixture of a 90%-cummulated particle diameter of 1 µm or less, including compounds of at least lead, zirconium and titanium, and a titanium oxide converts to an anatase type which is present at least 80% by weight % of the titanium oxide.

16. A piezoelectric element production method for producing a piezoelectric element comprising:
calcining said material mixture to obtain a calcined result;
crushing said calcined result to obtain temporarily fired powder; and
performing main firing on said calcined powder to obtain said piezoelectric ceramic composed of a sintered body, wherein the piezoelectric element includes a piezoelectric layer, the piezoelectric layer is composed of a piezoelectric ceramic, the piezoelectric ceramic includes a compound oxide having a perovskite structure, and the compound oxide mainly contains lead, zirconium, titanium, zinc and niobium, said piezoelectric ceramic is produced by using a material mixture of a 90%-cummulated particle diameter of 1 µm or less, including compounds of lead, zirconium, titanium, zinc and niobium, and a titanium oxide converts to an anatase type which is present at least 80% by weight % of the titanium oxide.

17. A piezoelectric element production method for producing a piezoelectric element, the method comprising:
calcining said material mixture to obtain a calcined result;
crushing said calcined result to obtain temporarily fired powder; and
performing main firing on said calcined powder to obtain said piezoelectric ceramic composed of a sintered body, wherein the piezoelectric element includes a piezoelectric layer, the piezoelectric layer is composed of a piezoelectric ceramic, the piezoelectric ceramic includes a compound oxide having a perovskite structure, and the compound oxide mainly contains lead, zirconium, titanium, zinc, magnesium and niobium, said piezoelectric ceramic is produced by using a material mixture of a 90%-cummulated particle diameter of 1 µm or less, including compounds of lead, zirconium, titanium, zinc, magnesium and niobium, and a titanium oxide converts to an anatase type which is present at least 80% by weight % of the titanium oxide.

18. A piezoelectric element production method for producing a piezoelectric element, the method comprising:
calcining said material mixture to obtain a calcined result;
crushing said calcined result to obtain temporarily fired powder; and
performing main firing on said calcined powder to obtain said piezoelectric ceramic composed of a sintered body, wherein the piezoelectric ceramic includes a piezoelectric layer, the piezoelectric layer is composed of a piezoelectric ceramic, the piezoelectric ceramic includes a compound oxide having a perovskite structure, the compound oxide mainly contains lead, zirconium, titanium, zinc and niobium and at least one kind selected from barium, strontium and calcium, said piezoelectric ceramic is produced by using a material mixture of a 90%-cummulated particle diameter of 1 µm or less, including compounds of lead, zirconium, titanium, zinc and niobium and at least one kind of compound selected from barium, strontium and calcium, and a titanium oxide converts to an anatase type which is present at least 80% by weight % of the titanium oxide.

19. A piezoelectric element production method for producing a piezoelectric element, the method comprising:
calcining said material mixture to obtain a calcined result;
crushing said calcined result to obtain temporarily fired powder; and
performing main firing on said calcined powder to obtain said piezoelectric ceramic composed of a sintered body, wherein the piezoelectric element includes a piezoelectric layer, the piezoelectric layer is composed of a piezoelectric ceramic, the piezoelectric ceramic includes a compound oxide having a perovskite structure, the compound oxide mainly contains lead, zirconium, titanium, zinc, magnesium and niobium and at least one kind selected from barium, strontium and calcium, said piezoelectric ceramic is produced by using a material mixture of a 90%-cummulated particle diameter of 1 µm or less, including compounds of lead, zirconium, titanium, zinc, magnesium and niobium and at least one kind of compound selected from barium, strontium and calcium, and a titanium oxide converts to an anatase type which is present at least 80% by weight % of the titanium oxide.

20. A piezoelectric element production method for producing a piezoelectric element comprising:
calcining said material mixture to obtain a calcined result;
crushing said calcined result to obtain temporarily fired powder; and
performing main firing on said calcined powder to obtain said piezoelectric ceramic composed of a sintered body, wherein the piezoelectric element includes a piezoelectric layer, the piezoelectric layer is composed of a piezoelectric ceramic, the piezoelectric ceramic includes a main component and a subcomponent, the main component includes a compound oxide having a perovskite structure, wherein the compound oxide contains at least lead, zirconium and titanium, said subcomponent contains at least one kind of oxide selected from steel, nickel, copper and cobalt, a content of said subcomponent is 0.01 to 0.8 wt % in a conversion of oxides ($Fe_2O_3$, NiO, CuO and CoO) with respect to a weight of 1 mol of said main component, said piezoelectric ceramic is produced by using a material mixture of a 90%-cummulated particle diameter of 1 μm or less, including compounds of at least lead, zirconium and titanium, and a titanium oxide converts to an anatase type which is present at least 80% by weight % of the titanium oxide.

21. The piezoelectric element production method as set forth in claim 20, using the material mixture including sub component materials containing at least one kind of compound selected from steel, nickel, copper and cobalt corresponding to said oxides to be contained in said subcomponent other than the main component materials containing compounds of at least lead, zirconium and titanium.

22. The piezo electric element production method as set forth in claim 15, wherein after producing said piezoelectric ceramic and forming a piezoelectric layer, an electrode is formed on a surface of the piezoelectric layer.

23. A piezoelectric element production method for producing a multilayer piezoelectric element comprising an element body with piezoelectric layers and internal electrode layers that are alternately stacked, wherein
said piezoelectric layer is composed of a piezoelectric ceramic, the piezoelectric ceramic includes a compound oxide having a perovskite structure, the compound oxide contains at least lead, zirconium and titanium, and a titanium oxide converts to an anatase type which is present at least 80% by weight % of the titanium oxide,
the method including the steps of:
producing a piezoelectric layer ceramic green sheet by using a material mixture of a 90%-cummulated particle diameter of 1 μm or less, containing compounds of at least lead, zirconium and titanium;
forming a pre-fired element body by alternately stacking the produced piezoelectric layer ceramic green sheets and internal electrode precursor layers; and
forming said element body by performing main firing on said pre-fired element body at a temperature of 1100° C. or lower.

24. A multilayer piezoelectric element production method for producing a multilayer piezoelectric element comprising an element body with piezoelectric layers and internal electrode layers that are alternately stacked, wherein
said piezoelectric layer is composed of a piezoelectric ceramic, the piezoelectric ceramic includes a compound oxide having a perovskite structure, the compound oxide mainly contains lead, zirconium, titanium, zinc and niobium, and a titanium oxide converts to an anatase type which is present at least 80% by weight % of the titanium oxide,
the method including the steps of:
producing a piezoelectric layer ceramic green sheet by using a material mixture of a 90%-cummulated particle diameter of 1 μm or less, containing compounds of lead, zirconium, titanium, zinc and niobium;
forming a pre-fired element body by alternately stacking the produced piezoelectric layer ceramic green sheets and internal electrode precursor layers; and
forming said element body by performing main firing on said pre-fired element body at a temperature of 1100° C. or lower.

25. A multilayer piezoelectric element production method for producing a multilayer piezoelectric element comprising an element body with piezoelectric layers and internal electrode layers that are alternately stacked, wherein
said piezoelectric layer is composed of a piezoelectric ceramic, the piezoelectric ceramic includes a compound oxide having a perovskite structure, the compound oxide mainly contains lead, zirconium, titanium, zinc, magnesium and niobium, and a titanium oxide converts to an anatase type which is present at least 80% by weight % of the titanium oxide,
the method including the steps of:
producing a piezoelectric layer ceramic green sheet by using a material mixture of a 90%-cummulated particle diameter of 1 μm or less, containing compounds of lead, zirconium, titanium, zinc, magnesium and niobium;
forming a pre-fired element body by alternately stacking the produced piezoelectric layer ceramic green sheets and internal electrode precursor layers; and
forming said element body by performing main firing on said pre-fired element body at a temperature of 1100° C. or lower.

26. A multilayer piezoelectric element production method for producing a multilayer piezoelectric element comprising an element body with piezoelectric layers and internal electrode layers that are alternately stacked, wherein
said piezoelectric layer is composed of a piezoelectric ceramic, the piezoelectric ceramic includes a compound oxide having a perovskite structure, the compound oxide mainly contains lead, zirconium, titanium, zinc and niobium and at least one kind selected from barium, strontium and calcium, and a titanium oxide converts to an anatase type which is present at least 80% by weight % of the titanium oxide,
the method including the steps of:
producing a piezoelectric layer ceramic green sheet by using a material mixture of a 90%-cummulated particle diameter of 1 μm or less, containing compounds of lead, zirconium, titanium, zinc and niobium and at least one kind of compound selected from barium, strontium and calcium;
forming a pre-fired element body by alternately stacking the produced piezoelectric layer ceramic green sheets and internal electrode precursor layers; and
forming said element body by performing main firing on said pre-fired element body at a temperature of 1100° C. or lower.

27. A multilayer piezoelectric element production method for producing a multilayer piezoelectric element comprising an element body with piezoelectric layers and internal electrode layers that are alternately stacked, wherein
said piezoelectric layer is composed of a piezoelectric ceramic, the piezoelectric ceramic includes a compound oxide having a perovskite structure, the compound oxide mainly contains lead, zirconium, titanium, zinc, magnesium and niobium and at least one kind selected from barium, strontium and calcium, and a titanium oxide converts to an anatase type which is present at least 80% by weight % of the titanium oxide,
the method including the steps of:
producing a piezoelectric layer ceramic green sheet by using a material mixture of a 90%-cummulated particle diameter of 1 μm or less, containing compounds of lead, zirconium, titanium, zinc, magnesium and niobium and at least one kind of compound selected from barium, strontium and calcium;
forming a pre-fired element body by alternately stacking the produced piezoelectric layer ceramic green sheets and internal electrode precursor layers; and
forming said element body by performing main firing on said pre-fired element body at a temperature of 1100° C. or lower.

28. A multilayer piezoelectric element production method for producing a multilayer piezoelectric element comprising an element body with piezoelectric layers and internal electrode layers that are alternately stacked, wherein said piezoelectric layer is composed of a piezoelectric ceramic, the piezoelectric ceramic includes a main component and a subcomponent, said main component includes a compound oxide having a perovskite structure, the compound oxide contains at least lead, zirconium and titanium, a titanium oxide converts to an anatase type which is present at least 80% by weight % of the titanium oxide, said subcomponent includes at least one kind of oxide selected from steel, nickel, copper and cobalt, and a content of said subcomponent is 0.01 to 0.8 wt % in a conversion of oxides ($Fe_2O_3$, CoO, NiO and CuO) with respect to a weight of 1 mol of said main component, the method including the steps of:

producing a piezoelectric layer ceramic green sheet by using a material mixture of a 90%-cummulated particle diameter of 1 μm or less, containing compounds of at least lead, zirconium and titanium;

forming a pre-fired element body by alternately stacking the produced piezoelectric layer ceramic green sheets and internal electrode precursor layers; and forming said element body by performing main firing on said pre-fired element body at a temperature of 1100° C. or lower.

29. A multilayer piezoelectric element production method for producing a multilayer piezoelectric element comprising an element body with piezoelectric layers and internal electrode layers that are alternately stacked, wherein said piezoelectric layer is composed of a piezoelectric ceramic, the piezoelectric ceramic includes a compound oxide having a perovskite structure, the compound oxide contains at least lead, zirconium and titanium, and a titanium oxide converts to an anatase type which is present at least 80% by weight % of the titanium oxide, the method including the steps of:

producing a piezoelectric layer ceramic green sheet by using a material mixture of a 90%-cummulated particle diameter of 1 μm or less, containing compounds of at least lead, zirconium and titanium;

forming a through hole on the produced piezoelectric layer ceramic green sheets and filling a connection wire material mixture in the through hole;

forming a pre-fired element body by alternately stacking the filled ceramic green sheets and internal electrode precursor layers; and forming said element body by performing main firing on said pre-fired element body at a temperature of 1100° C. or lower.

30. A multilayer piezoelectric element production method for producing a multilayer piezoelectric element comprising an element body with piezoelectric layers and internal electrode layers that are alternately stacked, wherein said piezoelectric layer is composed of a piezoelectric ceramic, the piezoelectric ceramic includes a compound oxide having a perovskite structure, the compound oxide mainly contains lead, zirconium, titanium, zinc and niobium, and a titanium oxide converts to an anatase type which is present at least 80% by weight % of the titanium oxide, the method including the steps of:

producing a piezoelectric layer ceramic green sheet by using a material mixture of a 90%-cummulated particle diameter of 1 μm or less, containing compounds of lead, zirconium, titanium, zinc and niobium;

forming a through hole on the produced piezoelectric layer ceramic green sheets and filling a connection wire material mixture in the through hole;

forming a pre-fired element body by alternately stacking the filled ceramic green sheets and internal electrode precursor layers; and forming said element body by performing main firing on said pre-fired element body at a temperature of 1100° C. or lower.

31. A multilayer piezoelectric element production method for producing a multilayer piezoelectric element comprising an element body with piezoelectric layers and internal electrode layers that are alternately stacked, wherein said piezoelectric layer is composed of a piezoelectric ceramic, the piezoelectric ceramic includes a compound oxide having a perovskite structure, the compound oxide mainly contains lead, zirconium, titanium, zinc, magnesium and niobium, and a titanium oxide converts to an anatase type which is present at least 80% by weight % of the titanium oxide, the method including the steps of:

producing a piezoelectric layer ceramic green sheet by using a material mixture of a 90%-cummulated particle diameter of 1 μm or less, containing compounds of lead, zirconium, titanium, zinc, magnesium and niobium;

forming a through hole on the produced piezoelectric layer ceramic green sheets and filling a connection wire material mixture in the through hole;

forming a pre-fired element body by alternately stacking the filled ceramic green sheets and internal electrode precursor layers; and forming said element body by performing main firing on said pre-fired element body at a temperature of 1100° C. or lower.

32. A multilayer piezoelectric element production method for producing a multilayer piezoelectric element comprising an element body with piezoelectric layers and internal electrode layers that are alternately stacked, wherein said piezoelectric layer is composed of a piezoelectric ceramic, the piezoelectric ceramic includes a compound oxide having a perovskite structure, the compound oxide mainly contains lead, zirconium, titanium, zinc and niobium and at least one kind selected from barium, strontium and calcium, and a titanium oxide converts to an anatase type which is present at least 80% by weight % of the titanium oxide, the method including the steps of:

producing a piezoelectric layer ceramic green sheet by using a material mixture of a 90%-cummulated particle diameter of 1 μm or less, containing compounds of lead, zirconium, titanium, zinc and niobium and at least one kind of compound selected from barium, strontium and calcium;

forming a through hole on the produced piezoelectric layer ceramic green sheets and filling a connection wire material mixture in the through hole;

forming a pre-fired element body by alternately stacking the filled ceramic green sheets and internal electrode precursor layers; and forming said element body by performing main firing on said pre-fired element body at a temperature of 1100° C. or lower.

33. A multilayer piezoelectric element production method for producing a multilayer piezoelectric element comprising an element body with piezoelectric layers and internal electrode layers that are alternately stacked, wherein said piezoelectric layer is composed of a piezoelectric ceramic, the piezoelectric ceramic includes a compound oxide having a perovskite structure, the compound oxide mainly contains lead, zirconium, titanium, zinc, magnesium and niobium and at least one kind selected from barium, strontium and calcium, and a titanium oxide converts to an anatase type which is present at least 80% by weight % of the titanium oxide, the method including the steps of:

producing a piezoelectric layer ceramic green sheet by using a material mixture of a 90%-cummulated particle diameter of 1 µm or less, containing compounds of lead, zirconium, titanium, zinc, magnesium and niobium and at least one kind of compound selected from barium, strontium and calcium;

forming a through hole on the produced piezoelectric layer ceramic green sheets and filling a connection wire material mixture in the through hole;

forming a pre-fired element body by alternately stacking the filled ceramic green sheets and internal electrode precursor layers; and forming said element body by performing main firing on said pre-fired element body at a temperature of 1100° C. or lower.

34. A multilayer piezoelectric element production method for producing a multilayer piezoelectric element comprising an element body with piezoelectric layers and internal electrode layers that are alternately stacked, wherein said piezoelectric layer is composed of a piezoelectric ceramic, the piezoelectric ceramic includes a main component and a subcomponent, said main component includes a compound oxide having a perovskite structure, wherein the compound oxide contains at least lead, zirconium and titanium, a titanium oxide converts to an anatase type which is present at least 80% by weight % of the titanium oxide, said subcomponent includes at least one kind of oxide selected from steel, nickel, copper and cobalt, and a content of said subcomponent is 0.01 to 0.8 wt % in a conversion of oxides ($Fe_2O_3$, CoO, NiO and CuO) with respect to a weight of 1 mol of said main component, the method including the steps of:

producing a piezoelectric layer ceramic green sheet by using a material mixture of a 90%-cummulated particle diameter of 1 µm or less, containing compounds of at least lead, zirconium and titanium;

forming a through hole on the produced piezoelectric layer ceramic green sheets and filling a connection wire material mixture in the through hole;

forming a pre-fired element body by alternately stacking the filled piezoelectric layer ceramic green sheets and internal electrode precursor layers; and forming said element body by performing main firing on said pre-fired element body at a temperature of 1100° C. or lower.

35. The multilayer piezoelectric element production method as set forth in claim 28, using the material mixture including subcomponent materials containing at least one kind of compound selected from steel, nickel, copper and cobalt corresponding to said oxides to be contained in said subcomponent other than the main component materials containing compounds of at least lead, zirconium and titanium.

36. The multilayer piezoelectric element production method as set forth in any one of claims 23, further including the step of forming an electrode on a surface of said element body.

* * * * *